US011190894B2

(12) United States Patent
Dyreby

(10) Patent No.: US 11,190,894 B2
(45) Date of Patent: Nov. 30, 2021

(54) ACTIVE ROOM COMPENSATION IN LOUDSPEAKER SYSTEM

(71) Applicant: Bang & Olufsen A/S, Struer (DK)

(72) Inventor: Jakob Dyreby, Struer (DK)

(73) Assignee: BANG & OLUFSEN A/S, Struer (DK)

( * ) Notice: Subject to any disclaimer, the term of this patent is extended or adjusted under 35 U.S.C. 154(b) by 199 days.

(21) Appl. No.: 16/585,633

(22) Filed: Sep. 27, 2019

(65) Prior Publication Data

US 2020/0029163 A1 Jan. 23, 2020

Related U.S. Application Data

(63) Continuation of application No. 15/757,927, filed as application No. PCT/EP2015/079991 on Dec. 16, 2015, now Pat. No. 10,448,187.

(30) Foreign Application Priority Data

Oct. 8, 2015 (DK) ............................ PA201500619

(51) Int. Cl.
*H04R 3/04* (2006.01)
*H04S 7/00* (2006.01)
(Continued)

(52) U.S. Cl.
CPC ............... *H04S 7/301* (2013.01); *H04R 3/04* (2013.01); *H04R 5/02* (2013.01); *H04R 5/04* (2013.01); *H04S 7/303* (2013.01); *H04R 3/12* (2013.01)

(58) Field of Classification Search
CPC ... H04R 3/04; H04R 5/02; H04R 5/04; H04R 3/12; H04R 3/14; H04R 29/004
(Continued)

(56) References Cited

U.S. PATENT DOCUMENTS

| | | |
|---|---|---|
| 5,247,579 A | 9/1993 | Hardwick et al. |
| 6,760,451 B1 | 7/2004 | Craven et al. |

(Continued)

FOREIGN PATENT DOCUMENTS

| | | |
|---|---|---|
| EP | 1677573 A2 | 7/2006 |
| WO | WO-2007076863 A1 | 7/2007 |

OTHER PUBLICATIONS

Hatziantoniou P D et al: "Generalized Fractional-Octave Smoothing of Audio and Acoustic Responses", Journal of Audio Engineering Society, Audio Engineering Society , New York, NY, US, vol. 48, No. 4, Apr. 1, 2000 pp. 259-279.

(Continued)

*Primary Examiner* — Disler Paul
(74) *Attorney, Agent, or Firm* — Harness, Dickey & Pierce, P.L.C.; Anthony G. Fussner

(57) ABSTRACT

A method for compensating for acoustic influence of a listening room on an acoustic output from an audio system including at least a left and a right loudspeaker, the method comprising determining a left frequency response and a right frequency response, designing a left compensation filter $F_L$, and a right compensation filter $F_R$, and during playback applying the left and right filters to left and right channel inputs. According to the invention, a target response in the listening position is simulated, and the left and right compensation filters are designed to filter transfer functions based on the simulated target function multiplied by an inverse of the left/right frequency responses. By relying on a simulated target instead of relying on an empirical approach, the general impact of a room can be more accurately captured by the target functions.

20 Claims, 17 Drawing Sheets

(51) Int. Cl.
*H04R 5/02* (2006.01)
*H04R 5/04* (2006.01)
*H04R 3/12* (2006.01)

(58) Field of Classification Search
USPC ..... 381/91–92, 98–99, 56–57, 103, 302–303
See application file for complete search history.

(56) References Cited

U.S. PATENT DOCUMENTS

| | | | | |
|---|---|---|---|---|
| 9,674,633 | B2 | 6/2017 | Crutchfield et al. | |
| 10,063,984 | B2 | 8/2018 | Johnson et al. | |
| 10,244,314 | B2 | 3/2019 | Kriegel et al. | |
| 10,349,198 | B2 | 7/2019 | Dyreby | |
| 10,448,187 | B2 | 10/2019 | Dyreby | |
| 2005/0008170 | A1 | 1/2005 | Pfaffinger et al. | |
| 2005/0119879 | A1 | 6/2005 | Sung et al. | |
| 2006/0188101 | A1 | 8/2006 | Gunnarsson | |
| 2008/0031462 | A1 | 2/2008 | Walsh et al. | |
| 2009/0144036 | A1 | 6/2009 | Jorgensen et al. | |
| 2009/0274309 | A1 | 11/2009 | Pedersen | |
| 2009/0296959 | A1 | 12/2009 | Bongiovi | |
| 2009/0316930 | A1 | 12/2009 | Horbach et al. | |
| 2010/0119075 | A1 | 5/2010 | Xiang et al. | |
| 2010/0290643 | A1 | 11/2010 | Mihelich et al. | |
| 2011/0064258 | A1 | 3/2011 | Aggarwal et al. | |
| 2012/0063605 | A1 | 3/2012 | Tawada | |
| 2012/0113224 | A1 | 5/2012 | Nguyen et al. | |
| 2014/0101219 | A1 | 4/2014 | Tang et al. | |
| 2014/0161281 | A1* | 6/2014 | Nackvi | H04R 17/10 381/98 |
| 2014/0177854 | A1 | 6/2014 | Morton et al. | |
| 2014/0369527 | A1 | 12/2014 | Baldwin | |
| 2015/0223002 | A1 | 8/2015 | Mehta et al. | |
| 2015/0341008 | A1* | 11/2015 | Krishnaswamy | H03G 5/165 381/103 |
| 2015/0350804 | A1 | 12/2015 | Crockett et al. | |
| 2017/0230772 | A1 | 8/2017 | Johnson et al. | |
| 2017/0339504 | A1* | 11/2017 | Bharitkar | H04S 3/004 |

OTHER PUBLICATIONS

European Search Report for EP Application No. 20159477.7 which claims priority to the same parent application as the instant application, Jun. 9, 2020, 6 pages.

International Search Report and Written Opinion for PCT/EP2015/079983 filed Dec. 16, 2015 (published as WO 2017059933 on Apr. 13, 2017, 17 pages, dated Nov. 10, 2016.

International Search Report and Written Opinion for PCT/EP2015/079991 filed Dec. 16, 2015 (published as WO 2017059934 on Apr. 13, 2017, 17 pages, dated Nov. 8, 2016.

Nonfinal Office Action dated Sep. 20, 2018 for U.S. Appl. No. 15/757,939, filed Mar. 6, 2018, which claims priority to the same parent application as the instant application, 1 pages.

Nonfinal Office Action for U.S. Appl. No. 15/757,939, filed Mar. 6, 2018, which claims priority to the same parent application as the instant application, dated Mar. 4, 2019, 17 pages.

Notice of Allowance for U.S. Appl. No. 15/757,939, filed Mar. 6, 2018 which claims priority to the same parent application as the instant application; dated May 21, 2019, 9 pages.

Nonfinal Office Action for U.S. Appl. No. 15/757,927, filed Mar. 6, 2018, which claims priority to the same parent application as the instant application, dated Jan. 10, 2019, 12 pages.

Notice of Allowance for U.S. Appl. No. 15/757,927, filed Mar. 6, 2018 which claims priority to the same parent application as the instant application; dated May 28, 2019, 9 pages.

* cited by examiner

ACTIVE ROOM COMPENSATION IN LOUDSPEAKER SYSTEM

CROSS REFERENCE TO RELATED APPLICATIONS

This patent application is a continuation of U.S. patent application Ser. No. 15/757,927 filed Mar. 6, 2018, which published as US20180249272 on Aug. 30, 2018 and which is issuing as U.S. Pat. No. 10,448,187 on Oct. 15, 2019.

U.S. patent application Ser. No. 15/757,927 is a U.S. national stage filing under 35 U.S.C. § 371 of PCT International Application No. PCT/EP2015/079991 filed Dec. 16, 2015, which published as WO2017/059934 on Apr. 13, 2017.

PCT International Application No. PCT/EP2015/079991 claims priority to and the benefit of Denmark Application No. PA201500619 filed Oct. 8, 2015.

The entire contents of the above applications are incorporated herein by reference in their entirety.

FIELD OF THE INVENTION

The present invention relates to active compensation of the influence of the listening space or listening room on the acoustic experience provided by a pair of loudspeakers.

BACKGROUND OF THE INVENTION

In order to compensate for the acoustical behavior of the listening space, it is known to determine a transfer function LP for a given listening position, and introduce a filter in the signal path between the signal source and signal processing system (e.g. amplifier). In a simple case, the filter is simply 1/LP. In order to determine LP, a microphone (or microphones) is used to measure the behavior of a loudspeaker in the listening position (or positions) in a room. The calculated response (in the time domain or the frequency domain) is used to create the filter 1/LP that, in some way, is the reciprocal of the room's behavior. The response of the filter may be calculated in the frequency or time domain and it may or may not be smoothed. Various techniques are currently employed in many different varieties of systems.

Document WO 2007/076863 provides an example of such room compensation. In WO 2007/076863, in addition to the listening position transfer function LP, also a global transfer function G is determined using measurements in three positions spread out in the room. The global transfer function is empirically estimated, and intended to represent a general acoustic trend of the room. Although methods such as that disclosed in WO 2007/076863 provide significant advantages, there is a need to further improve existing room compensation methods.

General Disclosure of the Invention

It is a general object of the present invention to provide improved room compensation. It is particular useful for, but not limited to, an implementation in a loudspeaker system with directivity control.

A first inventive concept relates to method for compensating for acoustic influence of a listening room on an acoustic output from an audio system including at least a left and a right loudspeaker, the method comprising determining a left frequency response $LP_L$ between a signal applied to the left speaker and a resulting power average in a listening position, determining a right frequency response $LP_R$ between a signal applied to the right speaker and a resulting power average in the listening position, designing a left compensation filter $F_L$, designing a right compensation filter $F_R$, and, during playback, applying the left compensation filter to a left channel input, and applying the right compensation filter to a right channel input.

The method further comprises providing a simulated target function $H_T$ representing a simulated target response in the listening position, designing the left compensation filter $F_L$ to have a left filter transfer function based on the simulated target function $H_T$ multiplied by an inverse of the left response, and designing the right compensation filter $F_R$ to have a right filter transfer function based on the simulated target function $H_T$ multiplied by an inverse of the right response.

By relying on a simulated target instead of relying on an empirical approach, the general impact of a room can be more accurately captured by the target functions. Compared to prior art, the target is thus more analytically determined, and is not the result of a purely empirical approach.

The inventive concept in its broadest form applies a very straightforward approach to obtaining the filter functions. More sophisticated alternatives, including level normalization and various limitations, may be applied as discussed in the following.

According to one embodiment, the simulated target function is obtained by simulating the power emitted by a point source in a corner defined by three orthogonal walls into a one eights sphere limited by the three walls, and defining the simulated target function as the transfer function between the point source and the emitted power. The simulation may e.g. be an impulse response or it may be done in the frequency domain. Such a simulation approach has been found to provide advantageous targets for the filters.

The simulated emitted power may be a power average based on simulations in a plurality of points, preferably more than 12 points, for example 16 points, distributed on the one eighth sphere. A radius of the one eights sphere is based on size of listening room, preferably in the range 2-8 m, and may for example be 3 meters.

The simulated power average can be based on simulations in a plurality of points, preferably more than 12 points, for example 16 points, distributed on the one eighth square. A radius of the one eighth sphere is based on size of listening room, preferably in the range 2-8 m, and may for example be 3 meters.

Determining the left and right responses may involve measuring sound pressure in the listening position and in two complementary positions located in opposite corners of a rectangular cuboid having a centre point in the listening position, said rectangular cuboid being aligned with a line of symmetry between the left and right speakers, and forming an average sound pressure from the measured sound pressures.

By measuring the sound pressure in a plurality of locations, and forming the response as the power average, a less chaotic response is obtained, and strong fluctuations are avoided. By assuming a symmetrical arrangement of the speakers, and arranging the locations in opposite corners of a cuboid aligned with the plane of symmetry, the measurements will capture changes along all axis with respect to the symmetry plane (up, down, left, right).

According to one embodiment, the method further comprises determining a left roll-off frequency at which the left target function exceeds the left response by a given threshold, determining a right roll-off frequency at which the left target function exceeds the right response by a given threshold, calculating an average roll-off frequency based on the left and right roll-off frequencies, estimating a roll-off function as a high pass filter with a cut-off frequency based on the average roll-off frequency, and dividing the left and right responses with the roll-off function before designing the left and right filters.

This aspect of the invention provides an effective way to determine and maintain speaker dependent low-frequency behavior. As a consequence of the compensation, the resulting filter functions should be "flat-lined" below the roll-off frequency.

The high pass filter may be a Bessel filter, e.g. a sixth order Bessel filter. The cut-off frequency of the filter depends on the type of filter and the threshold level. For example, if a sixth order Bessel filter is chosen, for a threshold of 10 dB the factor is 1, while for a threshold of 20 dB the factor is 1.3.

According to one embodiment, the method further comprises determining a filtered mono response $LP_M$ according to $LP_L\ F_L+LP_R\ F_R$, determining a filtered side response $LP_S$ according to $LP_L\ F_L-LP_R\ F_R$, wherein $LP_L$ is the left response, $LP_R$ is the right response, $F_L$ is the left filter and $F_R$ is the right filter, determining a mono target function based on the simulated target function $H_T$, determining a side target function based on the simulated target function $H_T$, designing a mono compensation filter $F_M$ having a mono filter transfer function based on the mono target function multiplied by an inverse of the mono response, designing a side compensation filter $F_S$ having a side filter transfer function based on the side target function multiplied by an inverse of the side response, and, during playback, applying the mono compensation filter to a mono signal based on the left and right input signals, and applying the side compensation filter to a side signal based on the left and right input signals.

According to this embodiment, filters are provided for mono and side channels in combination with left and right filters to provide left and right output signals which have been left/right filtered and mono/side filtered. One specific component of the characteristics of a listening room relates to modal frequencies that are dependent on the dimensions of the room. Conventional room compensation methods in loudspeaker systems use filters that have the reciprocal of the magnitude responses of this modal behavior. In other words, where the room mode creates an increase in the signal at a location in a listening room (due to resonating standing waves) the audio system includes a filter that reduces the signal by the same amount. By combining the left/right filters with specific mono/side filters, such effects are compensated for.

In one embodiment, the mono signal is formed as the sum of a left input signal and a right input signal, the side signal is formed as the difference between a left input signal and a right input signal, the left filter input is formed as the sum of the filtered mono channel input and the filtered side channel input, and the right filter input is formed as the difference between the filtered mono channel input and the side channel input.

The filters are thus cross-combined to provide left and right output signals which have been left/right filtered and mono/side filtered.

Two correlated sources (mono response) in a room will sum in phase at low frequencies and in power at high frequencies. Therefore, according to one embodiment, the mono target function is determined as the simulated target function multiplied by a shelving filter with a centre frequency in the order of 100 Hz and a gain in the order of one dB.

The side compensation filter can be chosen to have the same tendency as the mono compensation filter. According to one embodiment, the side target function is therefore determined as the mono target function reduced by a difference between a smoothed filtered mono response and a smoothed filtered side response.

The left and right filter transfer functions are preferably set equal to unity gain above 500 Hz to account for the fact that the influence of boundaries in the vicinity the room is limited for higher frequencies, e.g. frequencies above 300 Hz.

Such gain limitation may be accomplished by cross fading the transfer function to unity gain over a suitable frequency range, such as 200 Hz to 500 Hz.

Peaks in the mono and side responses may be removed by measuring a mono response in the listening position, applying the mono compensation filter to the measured mono response to form a filtered mono response, forming a difference between the filtered mono response and the mono target, forming a peak removing component as portions of said difference smaller than zero, and subtracting the peak removing component from the mono compensation filter and side compensation filter to form a peak cancelling mono compensation filter and a peak cancelling side compensation filter.

By adjusting the filters to remove or cancel peaks in the response based on actual measurements, the performance is improved further. Note that such peak cancellation is not restricted to the methods discussed above, but may be regarded as a separate inventive concept.

A further inventive concept, relates to a method for smoothing a response defined as a function in the frequency domain between a signal applied to a speaker and a resulting power average in a listening position, comprising determining a number of peaks per octave in the response, for a portion of the response where the number of peaks per octave is below a first threshold, smoothing the response with a first smoothing width, for a portion of the response where the number of peaks per octave is above a second threshold, smoothing the response with a second smoothing width, wherein said second threshold is greater than said first threshold and said second smoothing width is wider than said first smoothing width, and for a portion of the response where the number of peaks per octave is between the first and second thresholds, smoothing with an intermediate smoothing width.

By adjusting the smoothing width to the number of peaks per octave, an optimized smoothing can be achieved, which has proven to be very useful for smoothing audio responses. By optimizing the smoothing, improved audio performance may be achieved with a minimum of computational power.

The intermediate smoothing width is frequency dependent and may be an interpolation of the first and second smoothing width.

As examples, the first, narrow smoothing width can be less than ¼ octave, preferable ⅙ or 1⁄12 octave, and the second, wide smoothing width can be at least one octave.

As further examples, the first, smaller threshold can be less than eight peaks per octave, preferably five peaks per octave, and the second, greater threshold can be greater than eight peaks per octave, preferably ten peaks per octave.

The smoothing method may further comprise providing a reference by smoothing the response with a reference smoothing width, wherein the reference smoothing width is wider than the second, wide smoothing width, comparing the smoothed response and the reference, and for each frequency, selecting the maximum of the smoothed response and the reference as dip removed response.

By removing dips in the response, the introduction of peaks in the resulting filters may be avoided. As an example, the reference smoothing width can be at least two octaves.

The various inventive concepts disclosed herein may be combined with each other.

BRIEF DESCRIPTION OF THE DRAWINGS

These and other inventive concepts will be described in more detail with reference to the appended drawings, showing currently preferred embodiments.

DETAILED DESCRIPTION OF PREFERRED EMBODIMENTS

Figure 1:
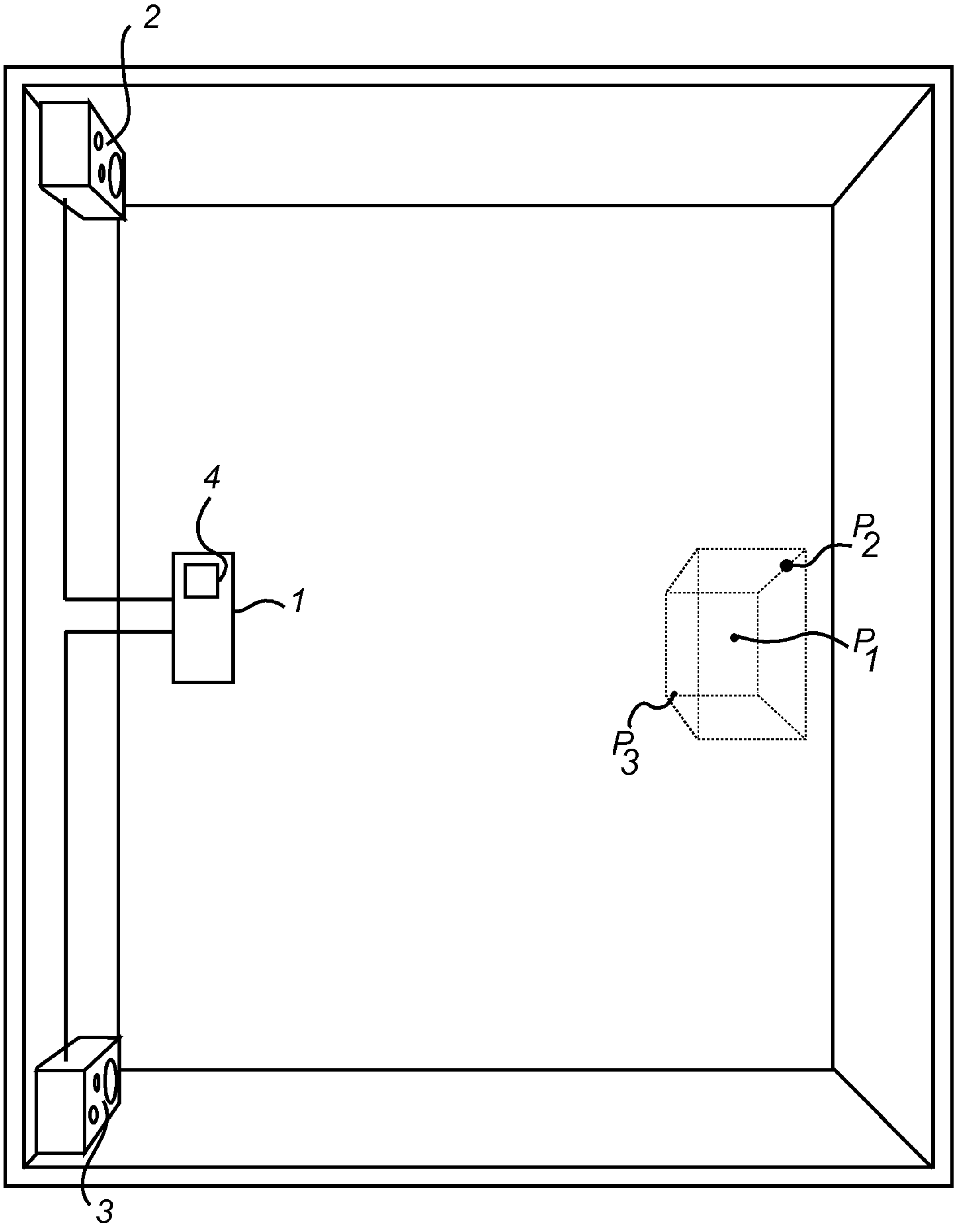
FIG. 1 is a schematic top view of a loudspeaker system in a listening room.

FIG. 1 shows one example of a system for implementing the present invention. The system includes a signal processing system 1 connected to two loudspeakers 2, 3. Embodiments of the invention may advantageously be implemented in controlled directivity loudspeaker systems, such as Beolab 90 ® speakers from Bang & Olufsen. A loudspeaker system with controlled directivity is disclosed in WO2015/117616, hereby incorporated by reference. FIG. 9 of this publication schematically shows the layout of one speaker, including a plurality of transducers in three different frequency ranges (high, mid, low), and a controller for controlling the frequency dependent complex gain of each transducer.

The signal processor 1 receives a left channel signal L and a right channel signal R, and provides processed, e.g. amplified, signals to the speakers. In order to compensate for the impact of the listening space or room on the resulting audio experience, a room compensation filter function 4 is implemented. Conventionally, such a filter function includes separate filters for each channel, left and right. The following disclosure provides several improvements of such filter functions according to embodiments of several inventive concepts.

The signal processing system 1 comprises hardware and software implemented functionality for determining frequency responses using one or several microphones and for designing filters to be applied by the filter function 4. The following description will focus on the design and application of such filters. Based on this description, a person skilled in art will be able to implement the functionality in hardware and software.

Response Measurements

The response from each speaker in a listening position is determined by performing measurements with a microphone in three different microphone positions in the vicinity of the listening position. In the illustrated example, a first position P1 is in the listening position, a second position P2 is in a corner of a rectangular cuboid having the listening position in its centre, and a third position P3 is in the opposite corner of the cuboid. The microphone is here a Behringer ECM8000 microphone.

Figure 2A:
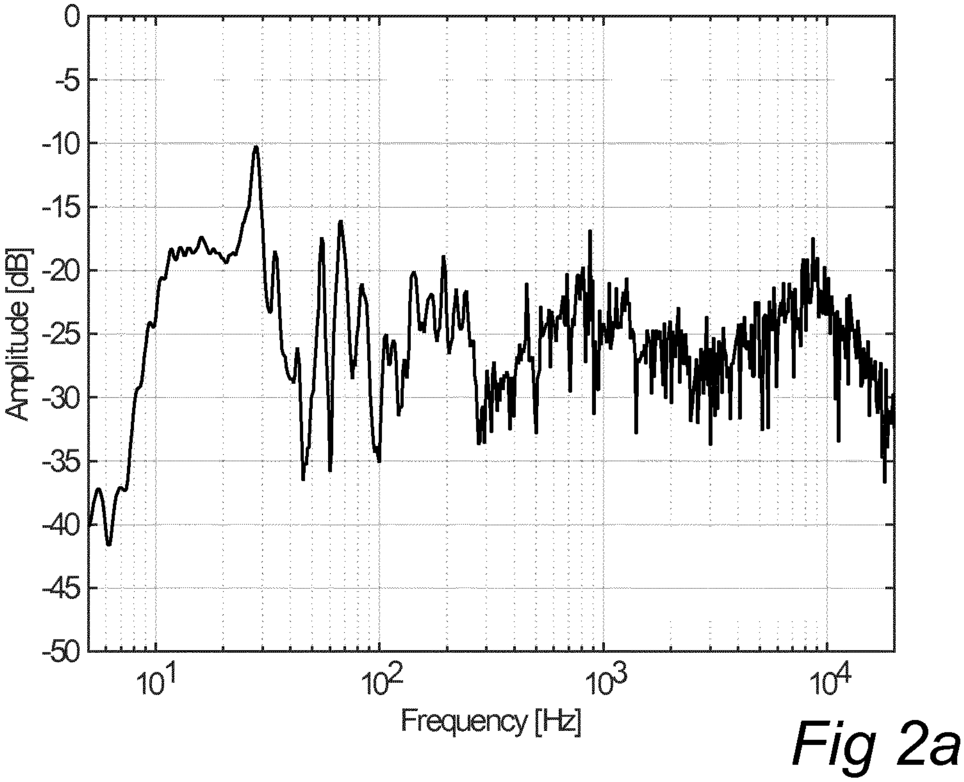
FIGS. 2*a* and 2*b* show left and right responses in a listening position.
Figure 2B:
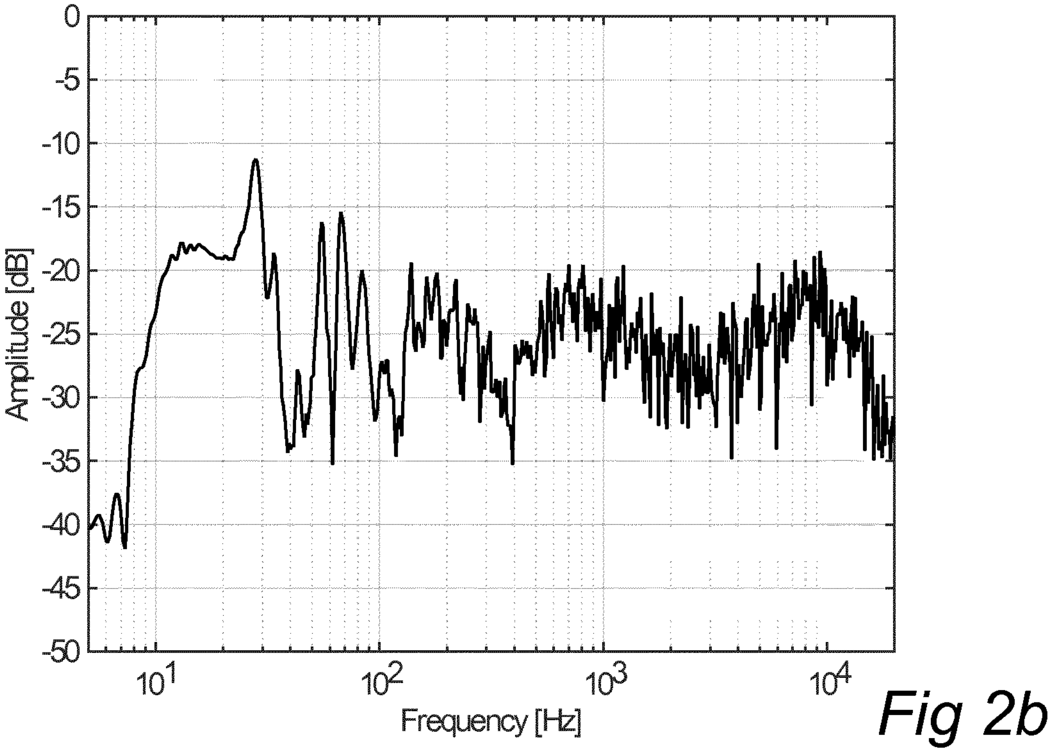

The sound pressure is measured from both speakers 2, 3 to each microphone position P1, P2, P3, so that a total of six measurements are performed. For each measurement, a transfer function between the applied signal and the measured sound pressure is determined. For each speaker, the response is then determined as the power average of the three sound pressure transfer functions for that speaker. FIG. 2*a* shows left response $P_L$ and FIG. 2*b* shows the right response $P_R$.

The distance between the speakers and the listening position will have an impact on the response and filters as discussed below. In the illustrated case, a distance around two meters was chosen.

Target Definition

A target, i.e. a desired function between frequency and gain for a general room, is determined by simulating the power response of a point source in an infinite corner given by three infinite boundaries (i.e. representing a side wall, a back wall, and a floor). To avoid the sharp characteristic of a comb filter in the resulting target it may be advantageous to use more than one point source. In one example, four by four by four point sources (a total of 64) are distributed in the corner. The distances to the back wall are 0.5 m to 1.1 m in steps of 0.2 m, the distances to the side wall are 1.1 m to 1.7 m in steps of 0.2 m, and the distances to the floor are 0.5 m to 0.8 m in steps of 0.1 m.

Figure 3:
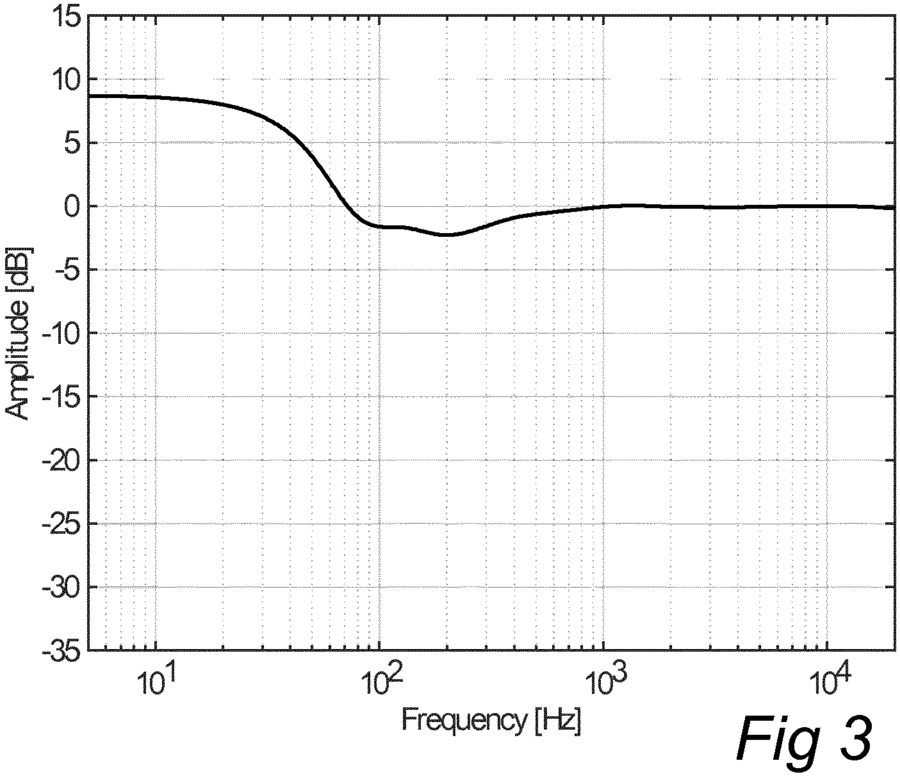
FIG. 3 shows a target response simulated according to an embodiment of the invention.

The power response is calculated as the power average of the impulse responses to a plurality of points, e.g. 16 points, distributed on a one eighth sphere limited by the three walls and with its center in the infinite corner. The radius of the sphere is selected based on the expected size of the room. The larger the radius, the smaller the level difference between direct sound and reflections from the walls will be. In the illustrated example, a radius of 3 m was chosen, corresponding to a normal living room. The response consists of the contribution from the point source added to the contributions from the seven mirror sources. At low frequencies the wavelength is so long that all sources are in phase adding to a total of 18 dB relative to the direct response. At high frequencies the summation of the sources is random adding to a total of 9 dB relative to the direct response. The simulated response is level adjusted to 0 dB at high frequencies, and finally smoothed using a smoothing width of one and a half octave in order to remove too fine details. The resulting simulated target function $H_T$ is shown in FIG. 3. Assuming a symmetrical room, as recommended for stereo listening, the left target $H_{TL}$, and the right target, $H_{TR}$, will be identical (and equal to $H_T$).

Roll-Off Detection

In order to maintain the (speaker dependent) roll off of the speaker in the actual room it is of interest to find the frequency where the simulated target is a given threshold (e.g. 20 dB) louder than the power average. First, the power average is aligned with the target in the frequency range from 200 Hz to 2000 Hz. The (left) alignment gain is found as:

$$L_L = 10 * \log \frac{\int_{200}^{2000} H_{TL}^2 df}{\int_{200}^{2000} P_L df}$$

The power average, $P_L$, is smoothed in dB with a smoothing width of one octave and multiplied by the alignment gain $L_L$. The −20 dB frequency is then found as the lowest frequency where this product is greater than $H_{TL}$-20.

A mean roll-off frequency $f_{RO}$ is calculated as the logarithmic mean of the left and right roll off frequencies, and a roll-off adjusted target is formed. In the given example, the roll-off adjusted target is formed by calculating the response of a sixth order high pass Bessel filter with a cut off frequency of 1.32 times the mean roll-off frequency and multiplying this response with the target.

Figure 4:
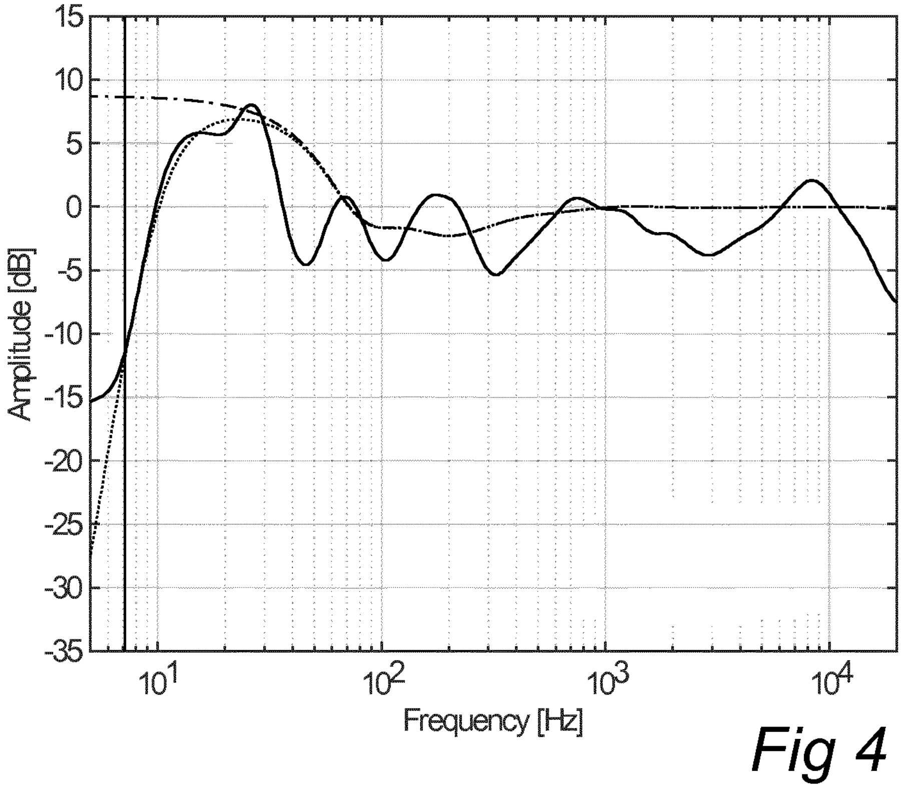
FIG. 4 shows roll-off adjustment of the target.

FIG. 4 shows the smoothed, level aligned response (solid line), the target (dot-dash) and the roll-off adjusted target (dotted). The calculated mean roll-off frequency $f_{RO}$ is also indicated.

Calculation of Left and Right Responses

Figure 5A:
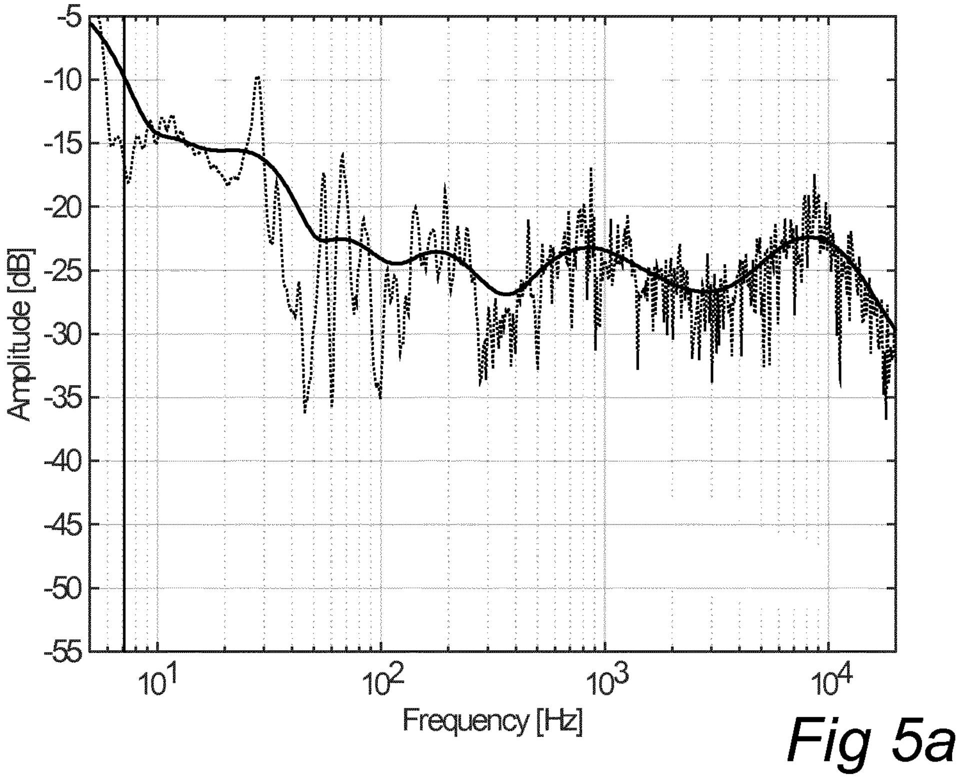
FIGS. 5*a* and 5*b* show roll-off adjusted and smoothed responses for both speakers.
Figure 5B:
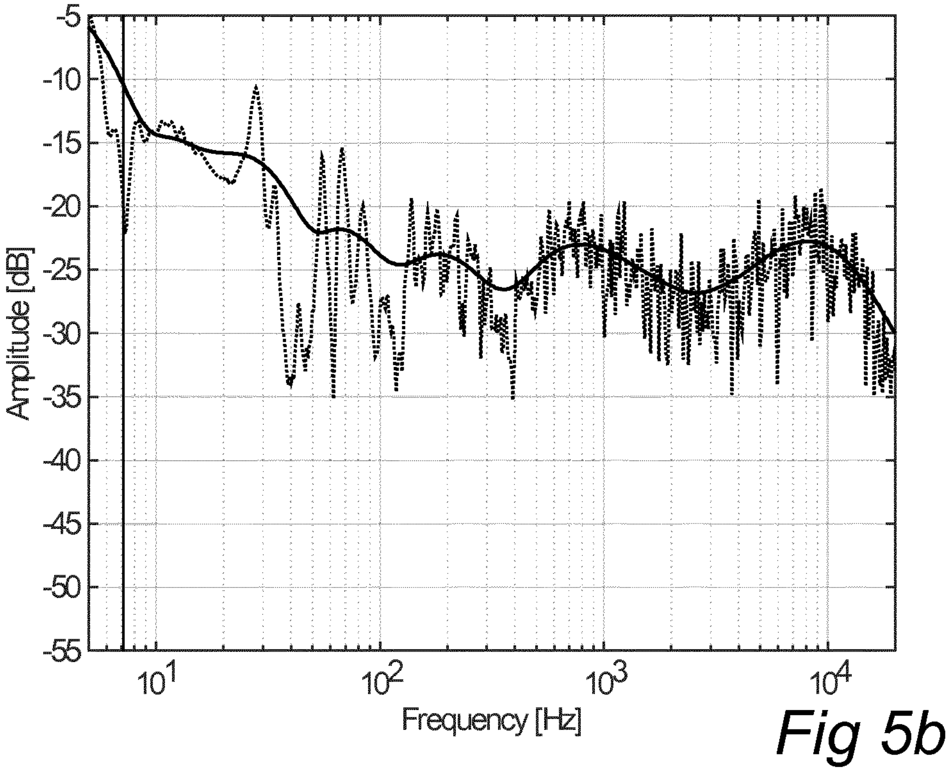

The left and right filters are intended to compensate for the influence of the near boundaries. Therefore, these filters should not compensate for modes and general room coloration. To obtain such behavior the left and right power averages are smoothed with a smoothing width of two octaves. To avoid that the smoothing affects the roll off, the power average is divided by the detected roll off prior to smoothing. For example, the Bessel filter discussed above may be used. FIGS. 5*a* and 5*b* show the left and right power averages divided by roll-off (dotted) and the smoothed versions (solid).

The filter response target $H_{FL}$ of the left speaker may now be calculated as:

$$H_{FL} = \frac{H_{TL}}{\sqrt{L_L \cdot P_{Lsm}}}$$

where $H_{TL}$ is the left target, $L_L$ is the alignment gain (see above), and $P_{Lsm}$ is the smoothed left response. By including the alignment gain the filter response target is centered around unity gain. The right filter target is calculated in the same way.

The influence of the boundaries in the vicinity of the speaker is limited above 300 Hz. For higher frequencies, the left and right responses should be equal to preserve staging. In order to achieve this, the left and right filter targets may be limited to this frequency range by cross-fading to unity gain from 200 Hz to 500 Hz in the magnitude domain.

Figure 6A:
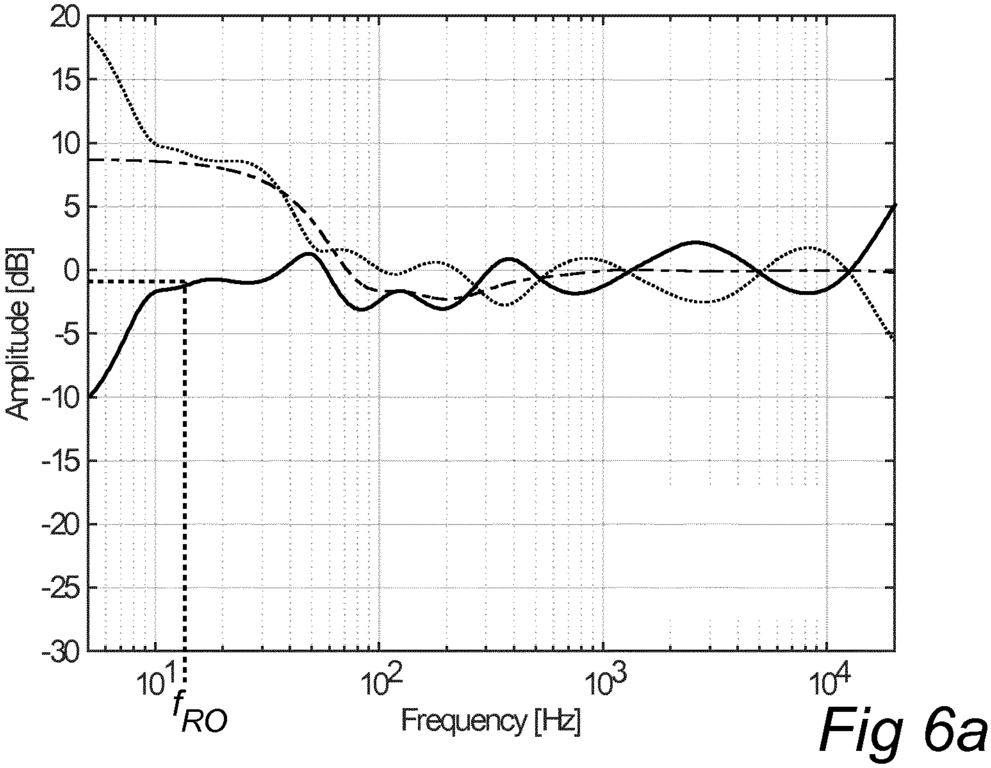
FIGS. 6*a* and 6*b* show frequency limited left and right filter targets.
Figure 6B:
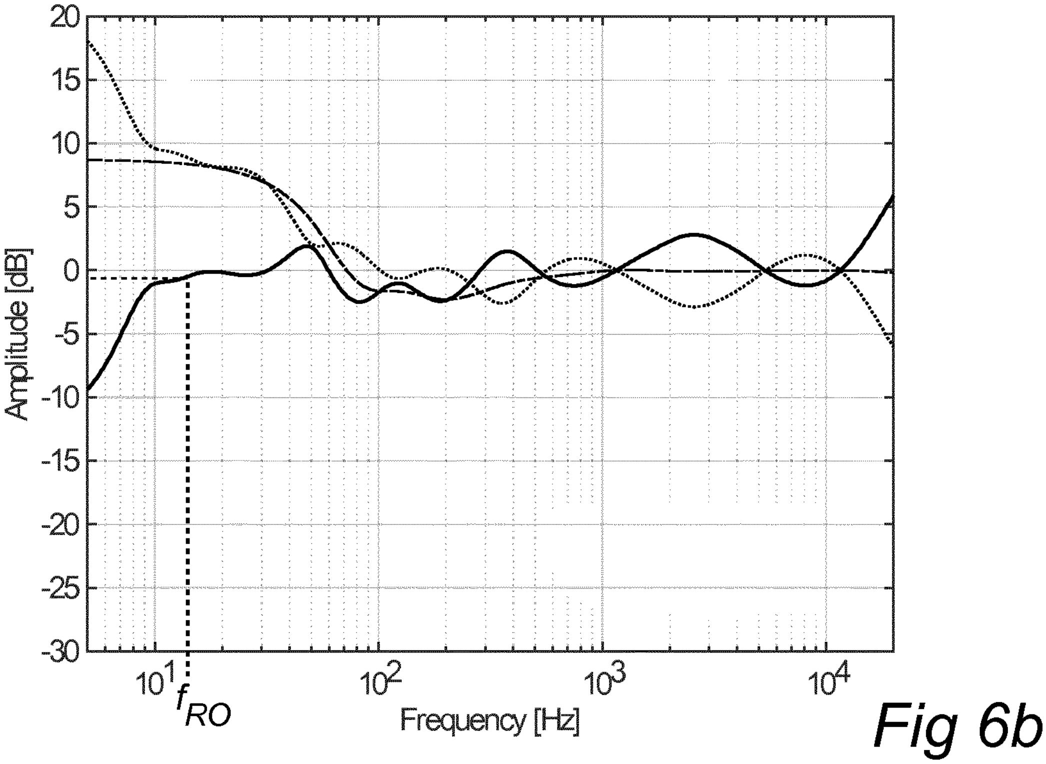

FIG. 6*a* shows the level-aligned smoothed power average $L_L \cdot P_{Lsm}$ (dotted), the target response $H_{TL}$ (dash-dot), and the filter target $H_{FL}$ (solid) after frequency band limitation for the left speaker. FIG. 6*b* shows corresponding curves for the right speaker.

The filters can be calculated as minimum phase IIR filters, e.g. using Steiglitz-McBride linear model calculation method, for example implemented in Matlab®. The filter target is used down to the calculated roll off frequency. For lower frequencies, the filter is set to be equal to their value in the cut-off frequency. This is indicated by dashed lines in FIGS. 6*a* and 6*b*.

Calculation of Mono and Side Filters

Figure 7A:
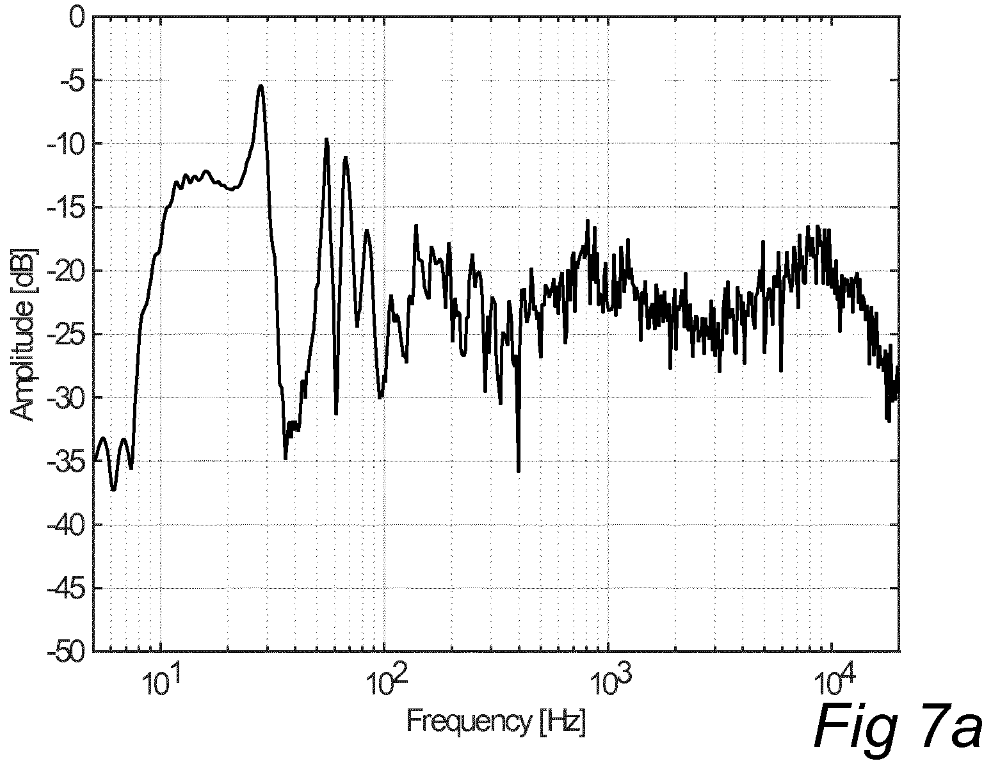
FIGS. 7*a* and 7*b* show mono and side responses in the listening position.
Figure 7B:
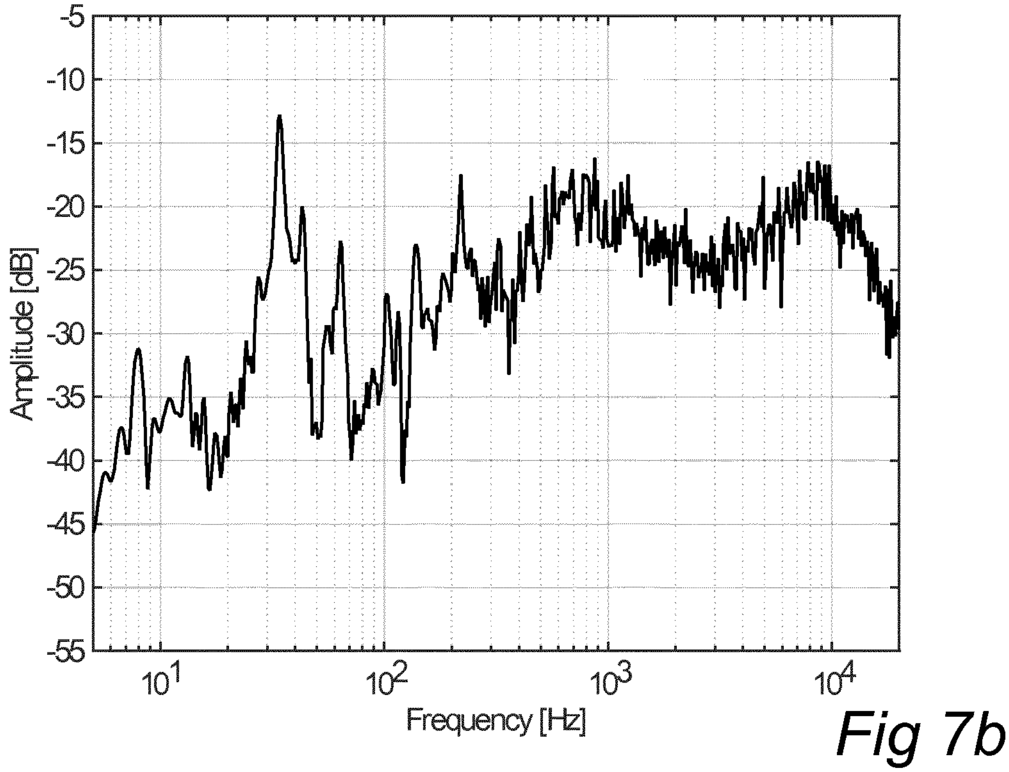

The reason for using different filters for the mono and side signals is that the room will be excited differently depending on whether the two speakers are playing the signal in the same polarity or opposite. The complex response to the ith microphone is calculated for mono and side input, $H_{Mi}$ and $H_{Si}$, according to:

$$H_{Mi} = H_{Li} H_{FL} + H_{Ri} H_{RF}$$

$$H_{Si} = H_{Li} H_{FL} - H_{Ri} H_{RF}$$

where $H_{Li}$ and $H_{Ri}$ are the left and right responses for microphone i, and $H_{LF}$ and $H_{RF}$ are the left and right filters as defined above. These calculated mono and side responses are also referred to as filtered mono and side responses, as they are based on left and right responses filtered by the left and right filters. FIGS. 7*a* and 7*b* show the power averages $P_M$ and $P_S$ based on the three measurements.

Above 1000 Hz the common power average of the mono and side inputs are calculated and used for both inputs. Therefore, the room compensations mono and side filters will be the same above 1000 Hz.

Variable Smoothing

It is of interest to apply as much smoothing as possible without losing the details of the measured power response in order to minimize the filter complexity and potential influence on time response. To this end, a smoothing with varying smoothing width is proposed. It is noted that this smoothing is considered to form a separate inventive concept, applicable not only to smoothing of responses but also to other signals in the frequency domain.

To find the frequencies where it is beneficial to use a narrow smoothing the signal is analyzed for local peaks and dips, and the smoothing width is chosen as a function of number of peaks/dips per octave.

To reduce the sensitivity to noise it may be beneficial to only detect peaks and dips when they are more than a given threshold, e.g. 1 dB, apart. To avoid the detection of multiple peaks and dips in the valleys of the signal it may further be useful to compare the unsmoothed signal with a smoothed version, e.g. smoothed with a smoothing width of two octaves. The larger value is chosen frequency by frequency in order to form a signal without valleys. The dips are then simply formed as a point between two peaks.

Figure 8A:
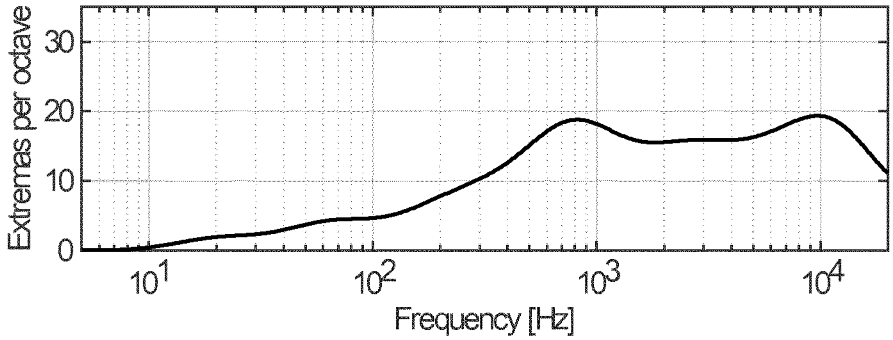
FIG. 8*a* shows the number of peaks/dips per octave for the mono response in FIG. 7*a*.

FIG. 8*a* shows the number of peaks/dips per octave as function of frequency for the mono response in FIG. 7*a*, calculated as outlined above and smoothed.

The smoothing width may now be chosen as a function of the number of peaks/dips per octave. For example, when the number of peaks/dips is below a given threshold, a narrower smoothing width may be chosen, and when the number of peaks is above a given threshold, a wider smoothing width may be chosen.

Figure 8B:
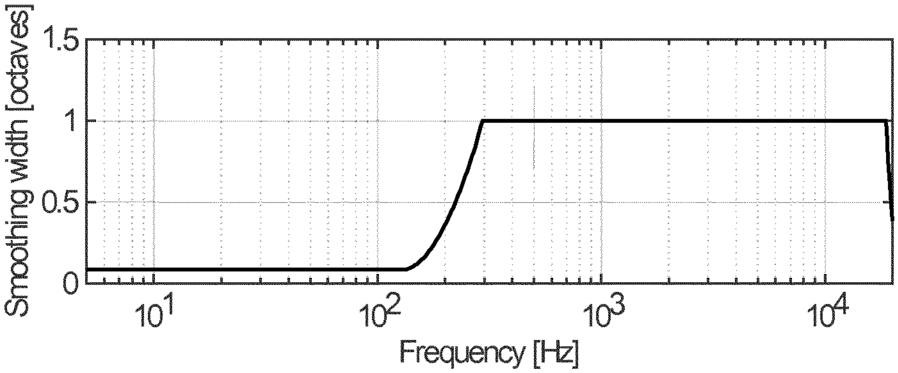
FIG. 8*b* shows a variable smoothing width determined according to an embodiment of the invention.

According to one embodiment, a smoothing width of one twelfth of an octave may be used when the number of peaks and dips per octave is below five, and a smoothing width of an octave may be used when the number of peaks and dips per octave exceeds ten. When the number of peaks is between five and ten the smoothing width may be found by logarithmic interpolation between 1/12 and 1 octave. FIG. 8*b* shows the resulting variable smoothing width as function of frequency for the peaks/dips variable in FIG. 8*a*.

Smoothing the Mono Response

Figure 9A:
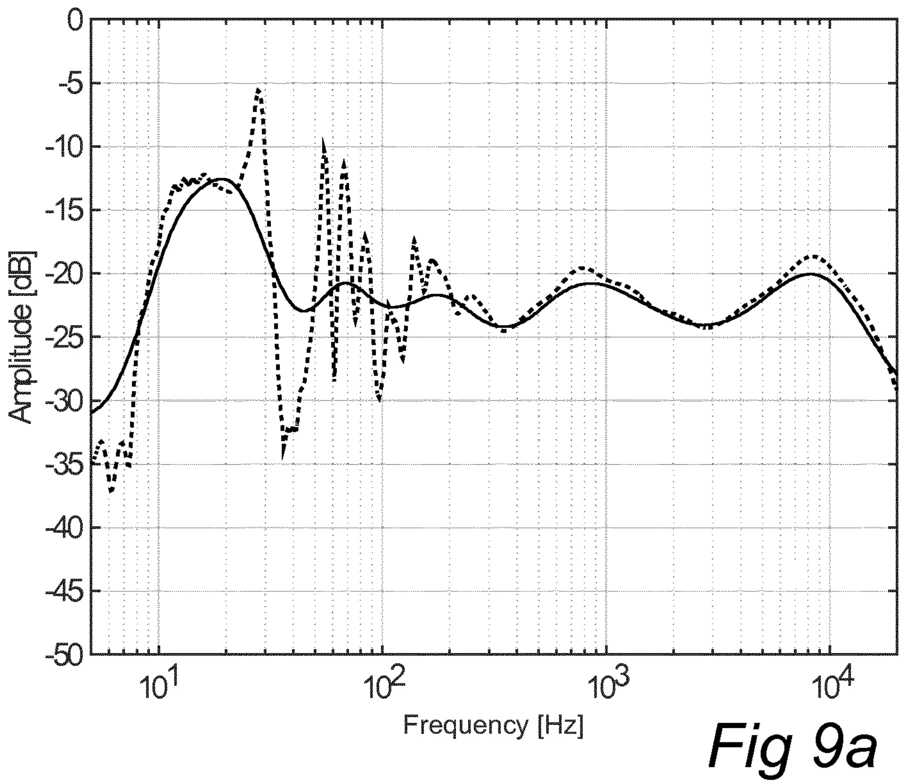
FIG. 9*a* shows the mono power response in FIG. 7*a* smoothed with the variable smoothing width in FIG. 8*b*.

FIG. 9*a* shows (solid) the mono power response in FIG. 7*a* smoothed with the variable smoothing width in FIG. 8*b*. Notice that the smoothed curve follows the power response in FIG. 7*a* well at low frequencies where the modal distribution is rather sparse. At higher frequencies the smoothing gets wider and does not follow the details of the power response.

Figure 9B:
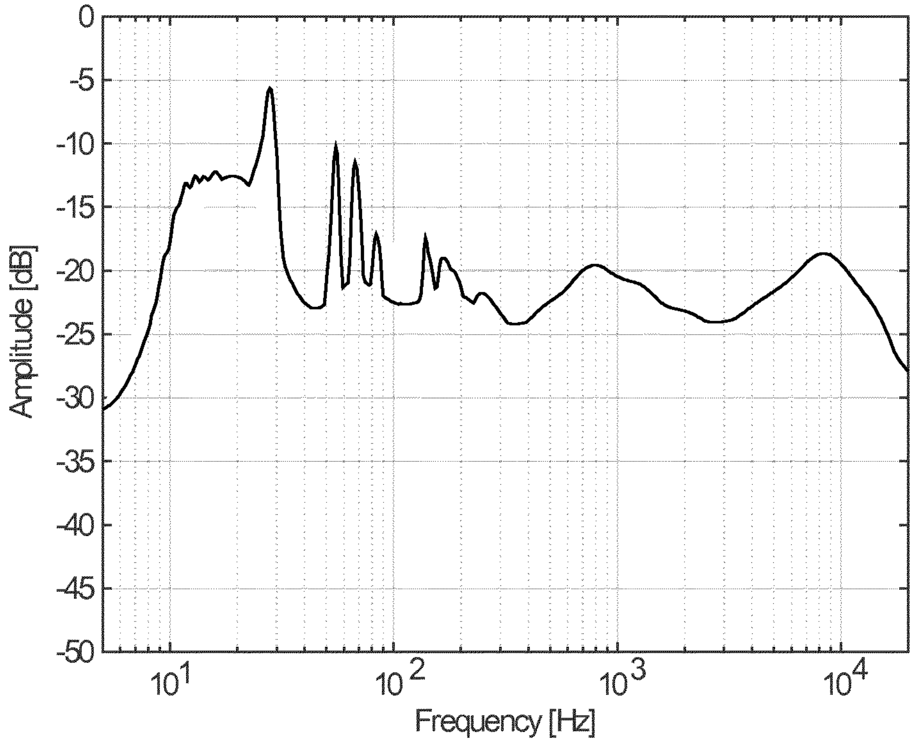
FIG. 9*b* shows a combined response without dips determined according to an embodiment of the invention.

In order to avoid the introduction of peaks in the room compensation filters it is of interest to minimize the dips in the response. Therefore, a combined response is formed by choosing, for each frequency, the maximum value of the variable smoothing in FIG. 9*a* and a two octave dB smoothing, also shown in FIG. 9*a* (dotted). FIG. 9*b* shows the resulting combined response. It is clear that in the combined response the peaks of the response are maintained while the dips are removed.

Mono and Side Targets

Figure 10A:
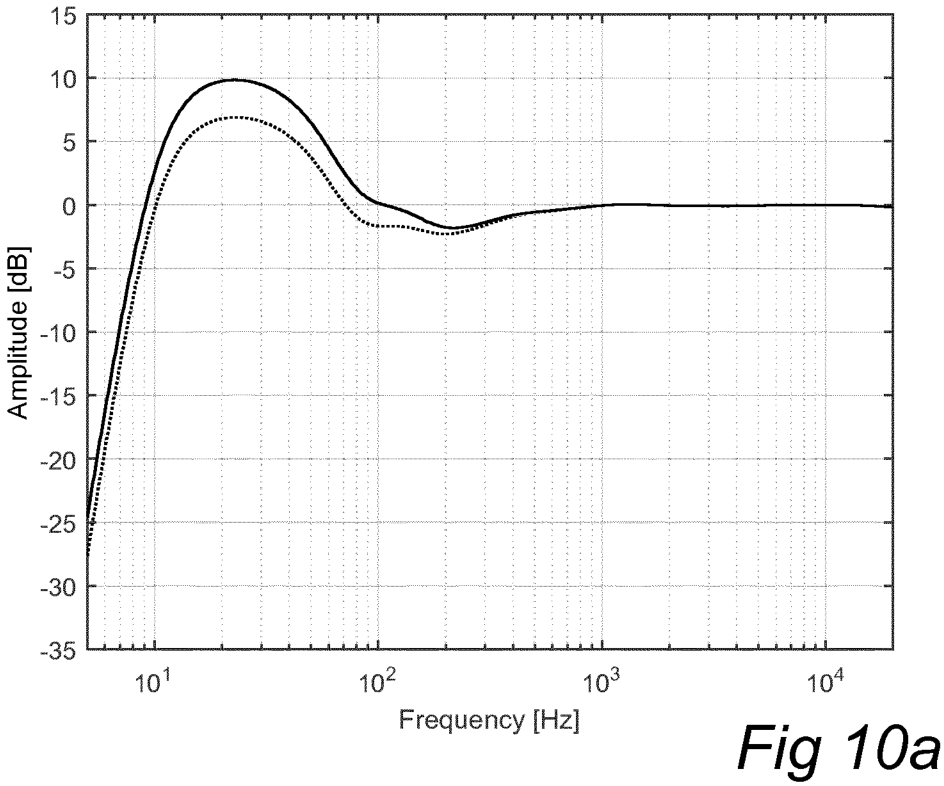
FIGS. 10*a* and 10*b* show the mono and side targets, determined according to an embodiment of the invention.

The power response of two correlated sources (mono response) in a room will sum in phase at low frequencies and in power at high frequencies. Therefore, the left/right target should be adjusted in order to form a suitable mono target. According to one embodiment, a low shelving filter with a center frequency of 115 Hz, a gain of 3 dB, and a Q of 0.6 is multiplied onto the left/right target to form the mono target. FIG. 10*a* shows the unsmoothed left/right target (dotted) and the mono target response $H_{TM}$ (solid).

The power response of two negatively correlated sources (side response) in a room depends heavily on the actual microphone positions. Consider the case of a perfectly symmetrical setup where the microphone is placed on the symmetry line. In this case the side response will be infinitely low as the responses from the left and right speakers to an omnidirectional microphone will be identical.

Figure 10B:
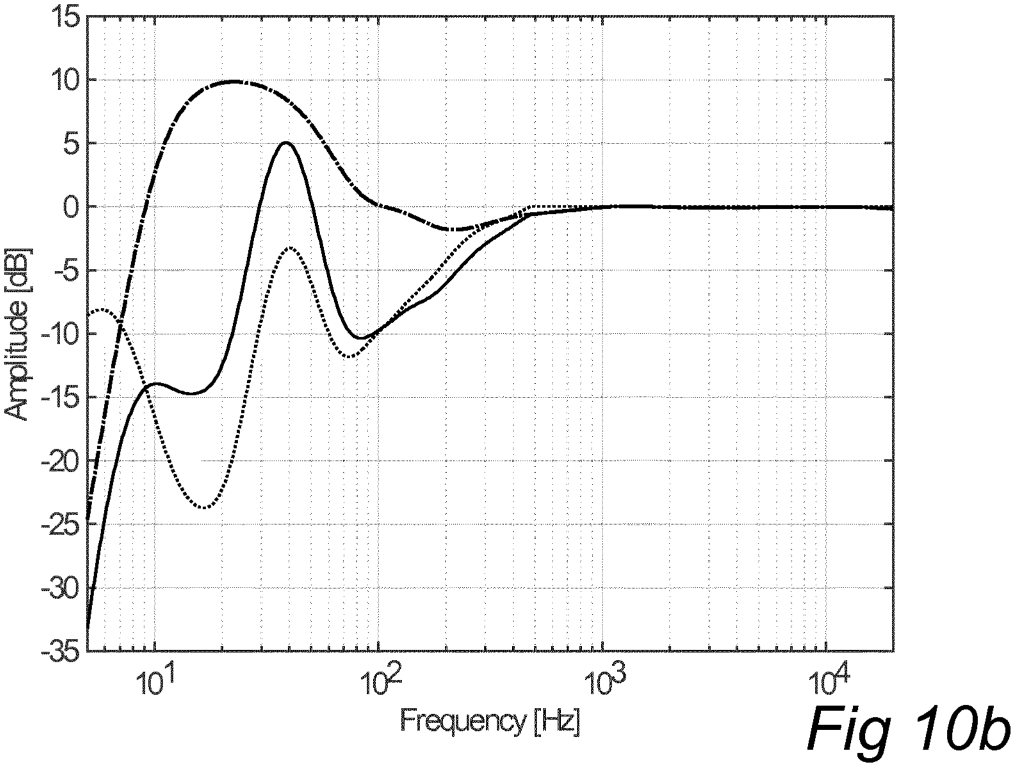

The side compensation filter can be chosen to have the same tendency as the mono compensation filter. In order to achieve that, the mono target in FIG. 10*a* is modified by the difference between the smoothed filtered side response and the smoothed filtered mono response in order to form the side target. FIG. 10*b* shows the difference between the smoothed mono and side responses (in dB using 2 octaves smoothing width) (dotted), the mono target (dash-dot) as shown in FIG. 10*a*, and the resulting side target response $H_{TS}$ (solid).

Mono and Side Filter Targets

In order to align the level of the responses an alignment gain $L_{MS}$ is calculated as:

$$L_{MS} = \frac{\int_{200}^{2000} H_{TM}^2 + H_{TS}^2 df}{\int_{200}^{2000} P_M + P_S df}$$

This alignment gain is multiplied onto the smoothed target responses (side and mono) to ensure that the filter response target is centered around unity gain. The mono filter response target $H_{FM}$ may now be calculated as:

$$H_{FM} = \frac{H_{TM}}{\sqrt{L_{MS} \cdot P_{Msm}}}$$

where $H_{TM}$ is the mono target, $P_{Msm}$ is the smoothed mono power response, and $L_{MS}$ is the alignment gain.

Figure 11A:
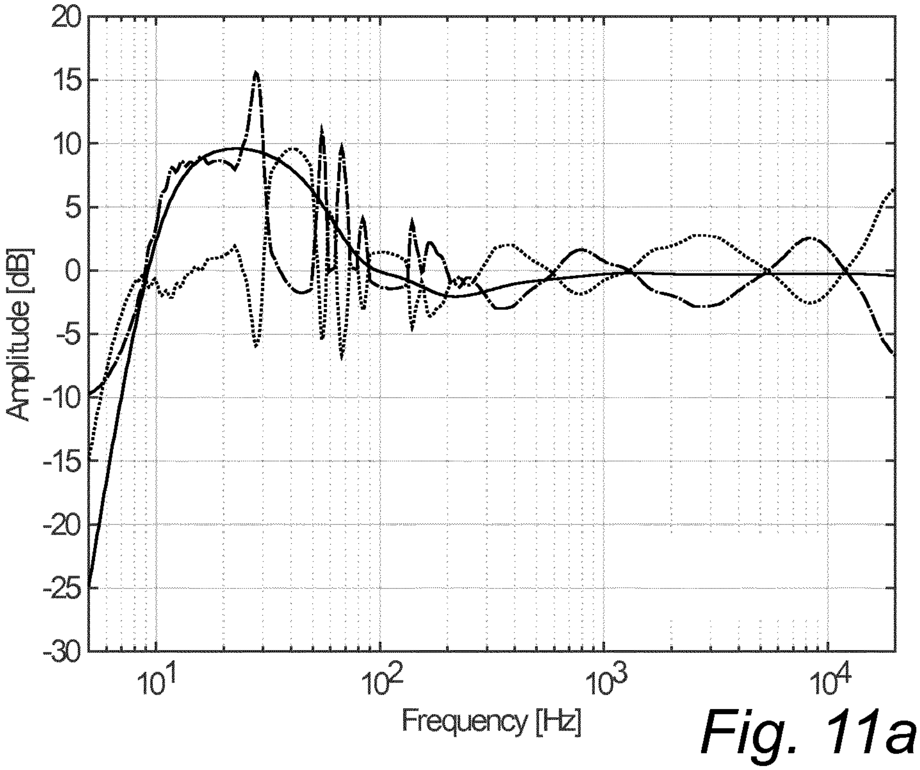
FIGS. 11*a* and 11*b* show frequency limited mono and side filter targets.

FIG. 11*a* shows the level-aligned smoothed mono power average (dash-dot), the mono target response (solid), and the mono filter response target (dotted).

Figure 11B:
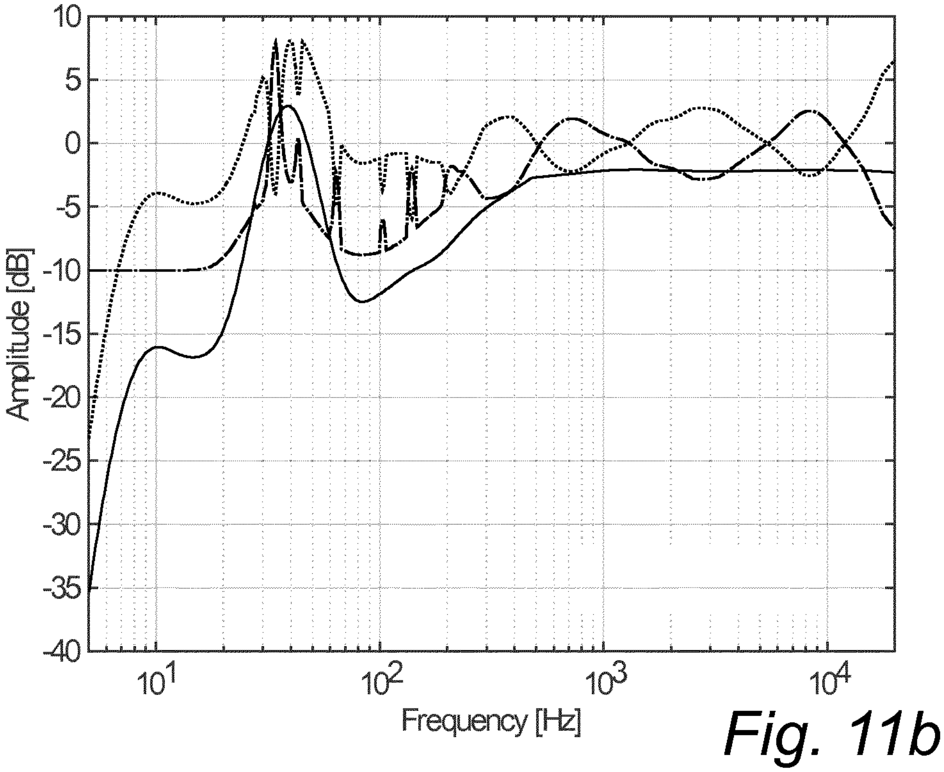

FIG. 11*b* shows corresponding curves for the side channel.

Peak Equalization of Mono and Side Response

In the following, a procedure for removing undesired peaks in the filtered mono and side responses will be described.

First, the mono filter target determined as above is multiplied to a mono response measured in the listening positions P1 and the result is smoothed using a variable smoothing width based on the number of extremas per octave as described above. As an example, when the number of peaks and dips per octave is below ten a smoothing width of one twelfth of an octave can be used, and when the number of peaks and dips per octave exceeds twenty a smoothing width of one octave can be used. Between ten and twenty extremas per octave the smoothing width can be found by logarithmic interpolation between 1/12 and 1 octave.

A peak removing component can now be determined as the difference between the target and the variably smoothed measured response. The gain of the additional filter is limited to zero dB, so that it includes only dips (attenuation of certain frequencies). Thereby, the additional filter will be designed to only remove peaks in the response.

Figure 12:
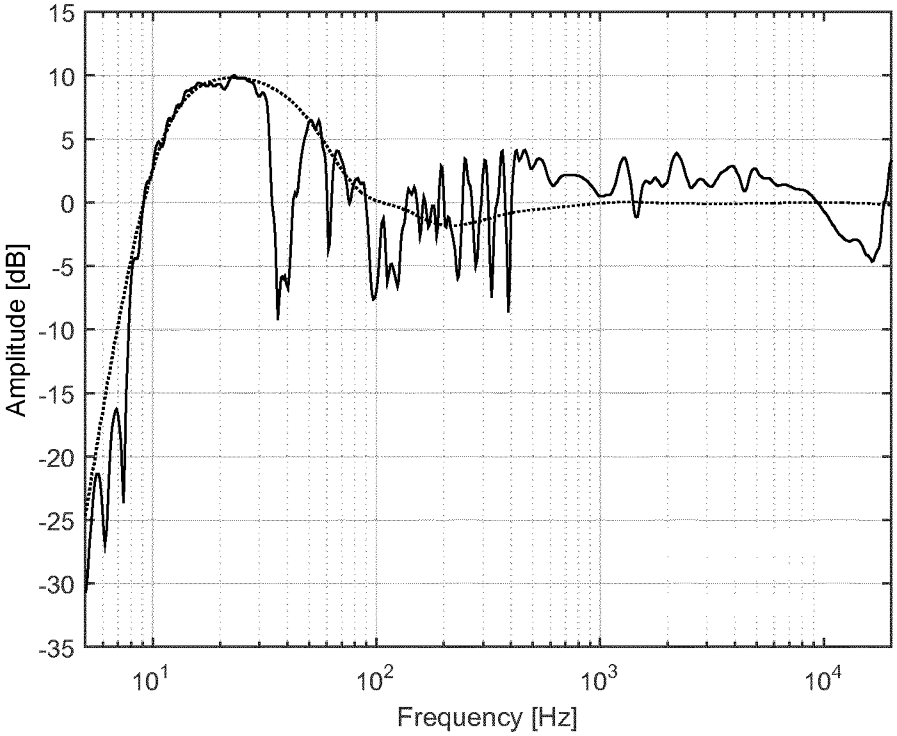
FIG. 12 shows an equalized and smoothed mono response in the listening position.
Figure 13A:
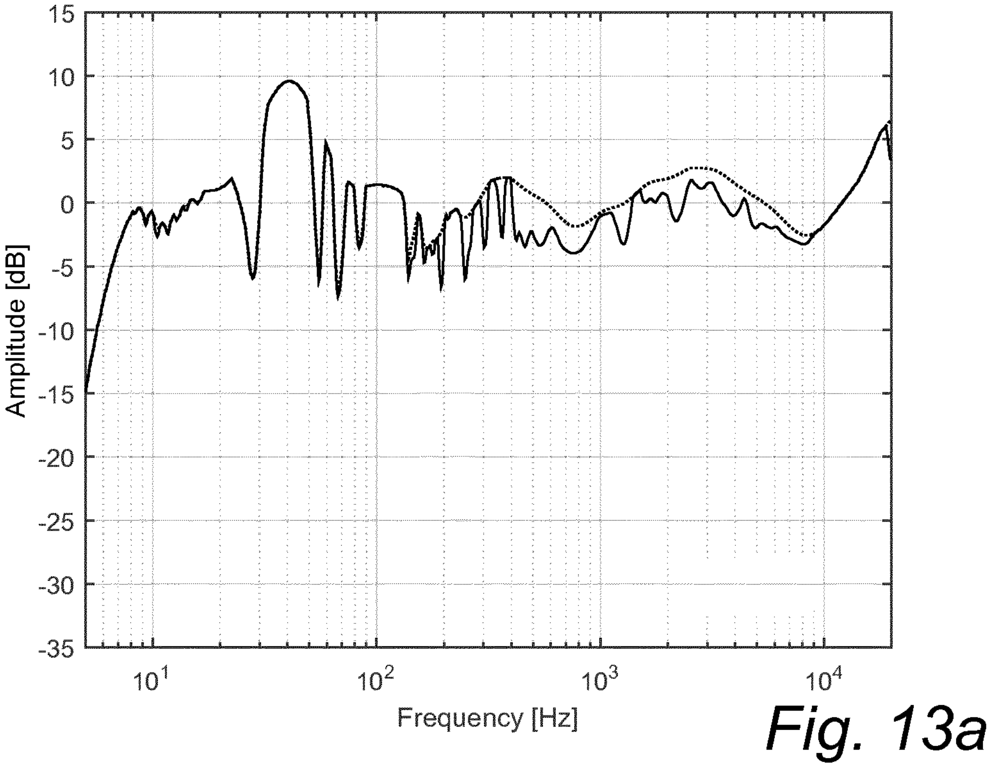
FIGS. 13*a* and 13*b* show mono and side filter targets before and after the introduction of dips.

FIG. 12 shows the equalized and smoothed mono response (solid) of the microphone in the listening position along with the mono target response (dotted). Filter dips will be introduced where the solid line exceeds the dotted line, which happens primarily for frequencies above 200 Hz. This frequency depends on the distance between the speakers and the listening position, and would be lower if a greater distance was used. FIG. 13*a* shows the mono filter target before (dotted) and after (solid) the introduction of dips calculated based on the first microphone mono response.

Figure 13B:
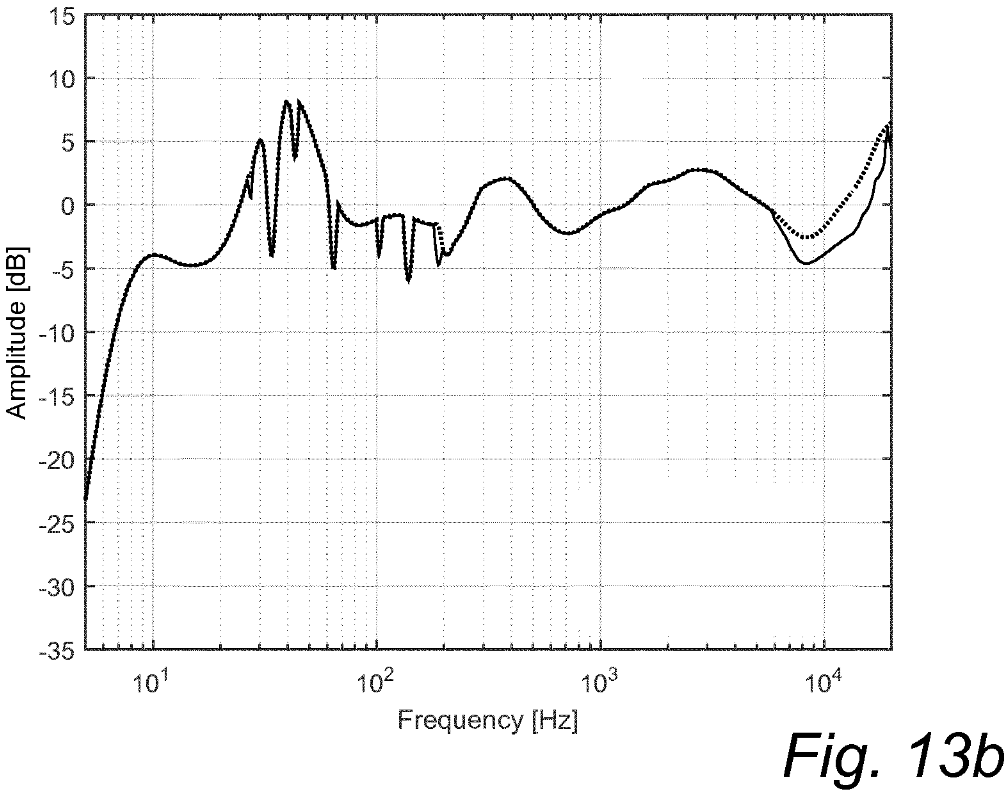

The side filter can be adjusted in a similar way, and FIG. 13*b* shows the side filter target before and after the introduction of dips calculated based on the first microphone side response.

Like the left and right filters, the mono and side filters can be calculated as minimum phase IIR filters, e.g. using Steiglitz-McBride linear model calculation method, for example implemented in Matlab®. Similar to the left and right filters discussed above, the filter target is used down to the calculated roll off frequency. For lower frequencies, the filter is set to be equal to their value in the cut-off frequency.

Optional Limiting of Mono and Side Filters

To avoid compensation at high frequencies, the mono and side filter target responses may be cross-faded to unity gain from 1 kHz to 2 kHz.

Further, the filter gain can be limited to the response of a low shelving filter at 80 Hz with a gain of 10 dB and a Q of 0.5. For example, the gain can be limited using a smoothing in dB with a width of one octave in the power domain. The maximum gain, frequency by frequency, of the left and right filter responses is then added to the calculation of the gain.

Still further, to avoid the introduction of sharp peaks in the filters the peaks in the mono and side filter targets can be smoothed. This can be done by finding the peaks and introducing local smoothing in a one fourth of an octave band around the peak. With this approach, closely spaced dips will be left unaffected.

Resulting Responses

Figure 14:
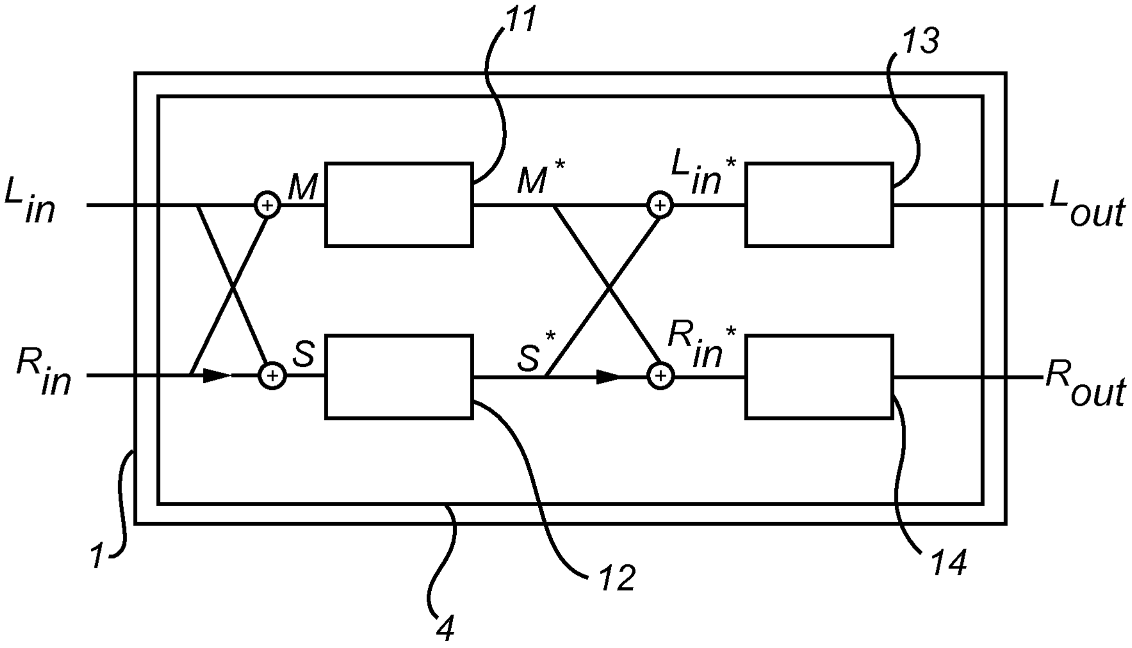
FIG. 14 shows a block diagram of a implementation of filter functions according to an embodiment of the present invention.

The filters discussed above maybe implemented in the filter function 4 of the signal processing system 1 in FIG. 1. FIG. 14 provides an example of how such a filter function 4 can be modified to allow application of left, right, mono and side filters to the left and right channels respectively.

In the illustrated case, the left and right input signals ($L_{in}$, $R_{in}$) are first cross-combined to form a side signal S and a mono signals M, and the mono and side filters 11, 12 are applied. The filtered mono and side signals (S*, M*) are then cross-combined to form modified left and right input signals ($L_{in}$*, $R_{in}$*), also referred to as left and right filter inputs. The left and right filters 13, 14 are applied to these signals to form the left and right output signals ($L_{out}$, $R_{out}$).

The following describes the power averaged responses when applying stereo room compensation according to the embodiments discussed above. Note that the left and right compensation does not affect modes which are handled by the mono and side compensation. Also it is noted that peaks are reduced and dips are left untouched.

Figure 15A:
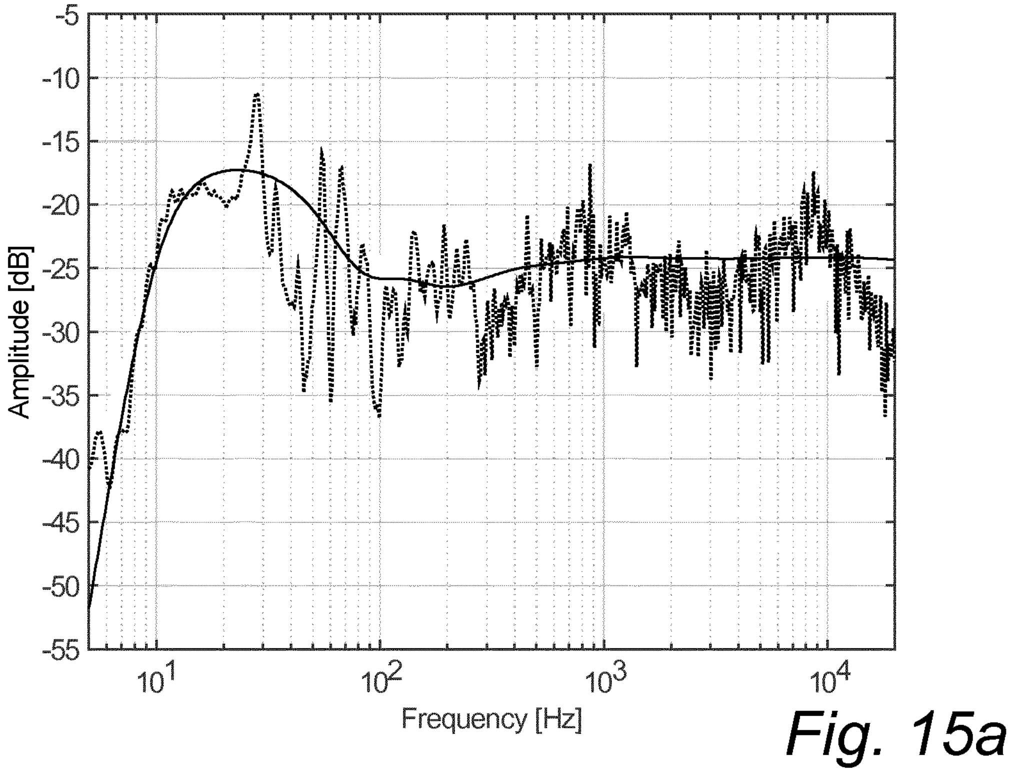
FIGS. 15*a* and 15*b* show pure left signals filtered according to an embodiment of the present invention.
Figure 15B:
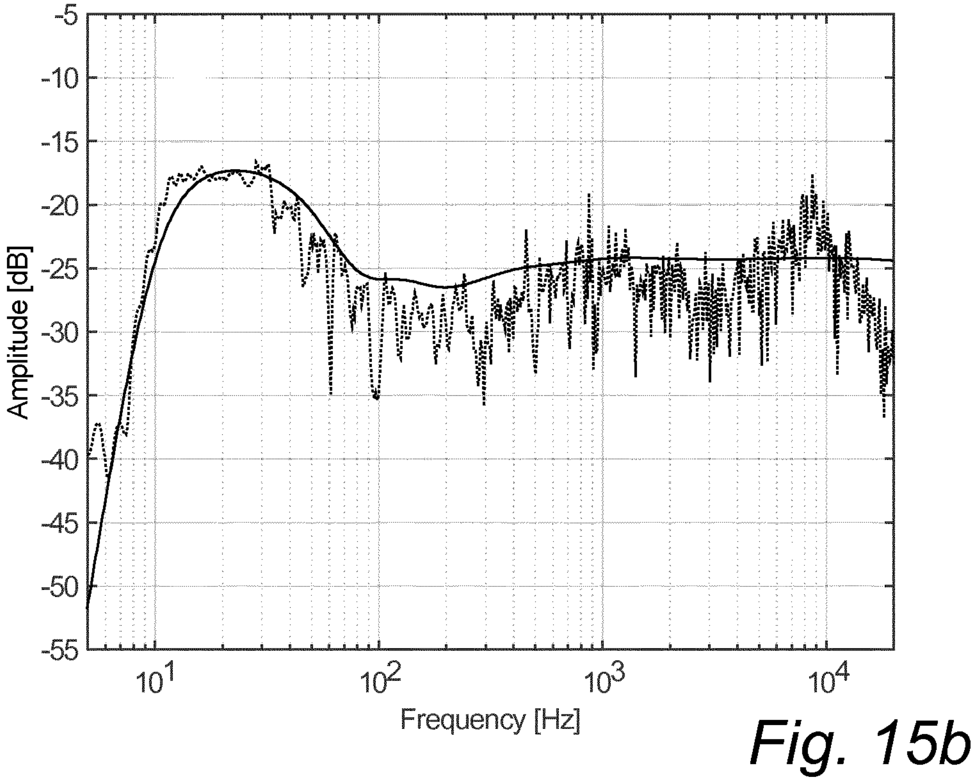

FIG. 15*a* shows the resulting response (dotted) when applying the left filter to a pure left signal along with the left target (solid). FIG. 15*b* shows the resulting response (dotted) when applying left, mono and side filters to a pure left signal along with the left target (solid).

Figure 16A:
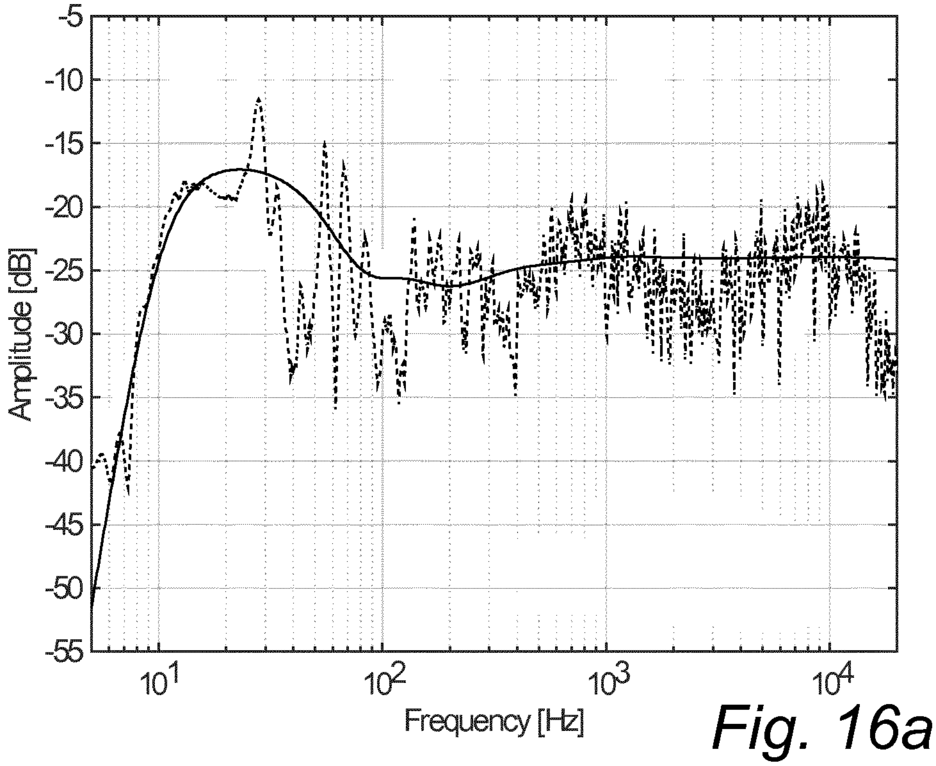
FIGS. 16*a* and 16*b* show pure right signals filtered according to an embodiment of the present invention.
Figure 16B:
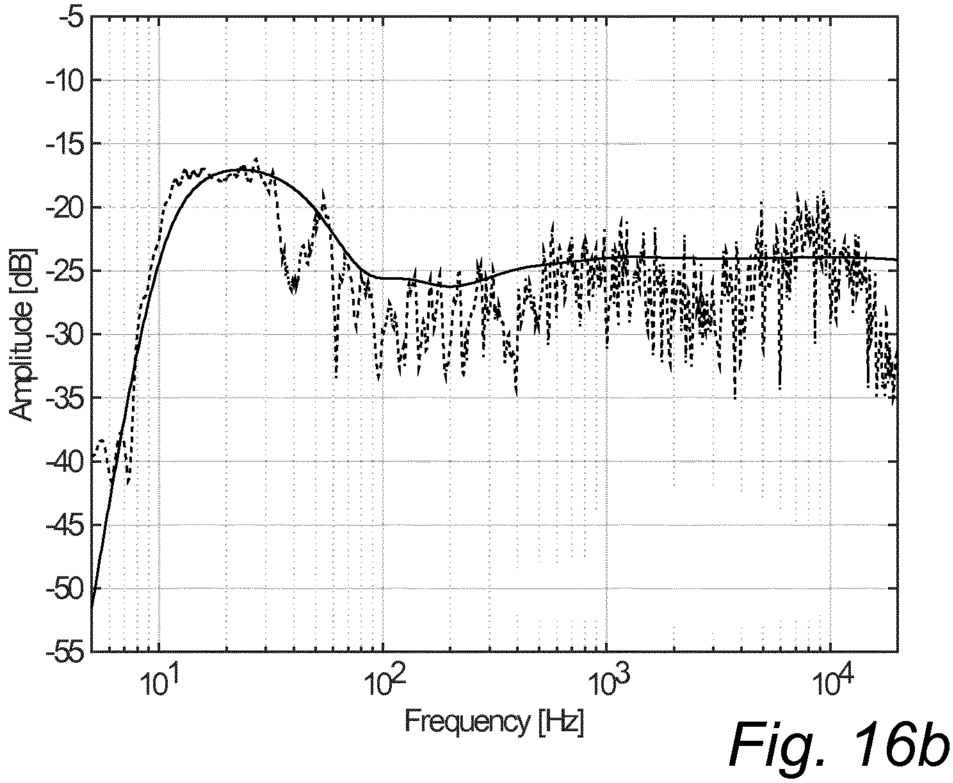

FIG. 16*a* shows the resulting response (dotted) when applying and the right filter to a pure right signal along with the right target (solid). FIG. 16*b* shows the resulting response (dotted) when applying right, mono and side filters to a pure right signal along with the right target (solid).

Figure 17A:
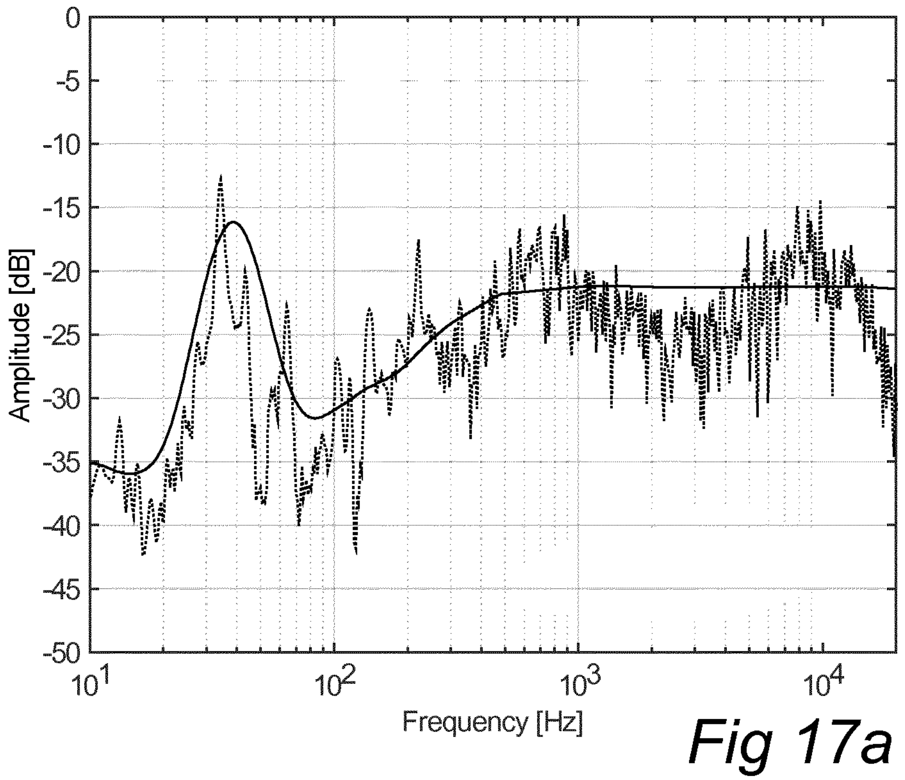
FIGS. 17*a* and 17*b* show pure mono signals filtered according to an embodiment of the present invention.
Figure 17B:
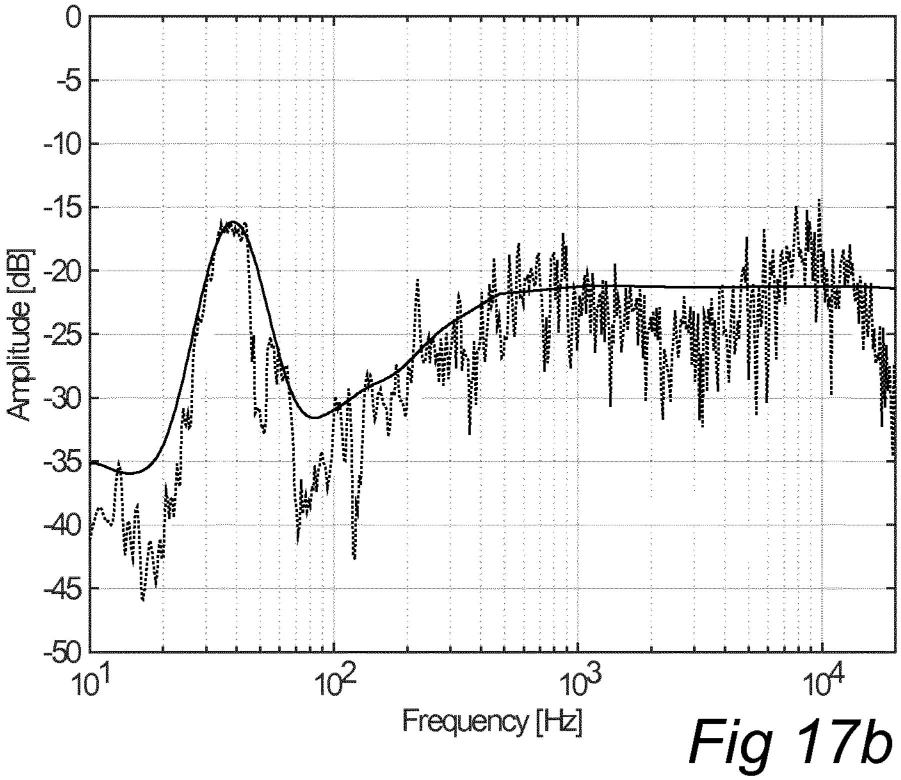

FIG. 17*a* shows the resulting response (dotted) when applying left and right filters to a pure side signal along with the side target (solid). FIG. 17*b* shows the resulting response (dotted) when applying left, right, and side filters to a pure side signal along with the side target (solid).

Figure 18A:
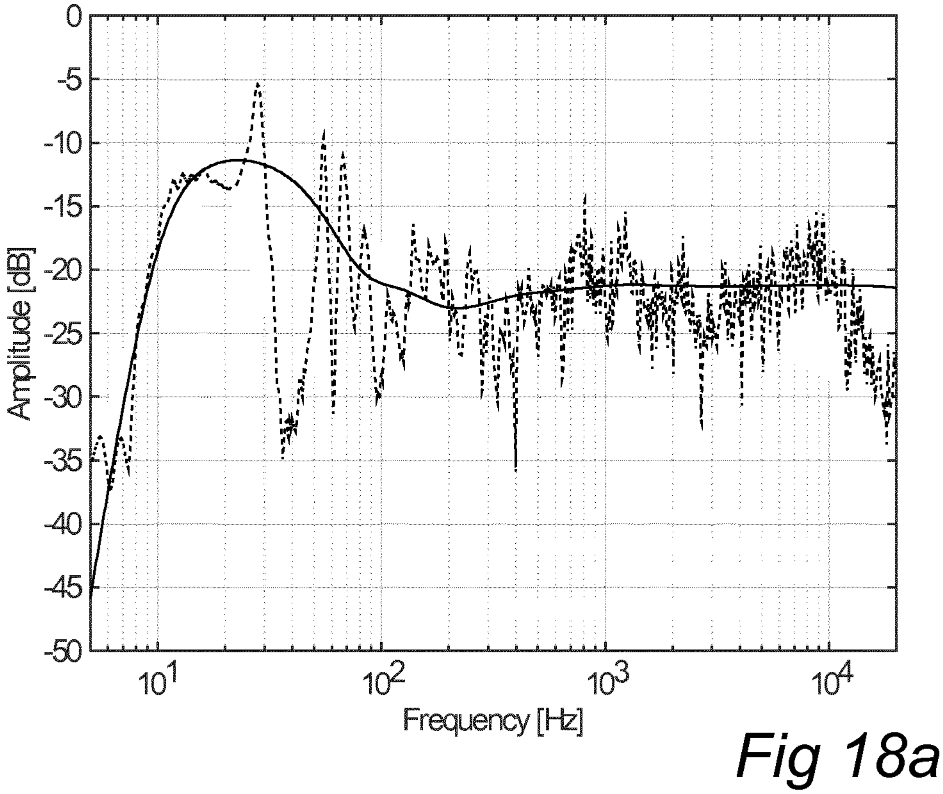
FIGS. 18*a* and 18*b* show pure side signals filtered according to an embodiment of the present invention.
Figure 18B:
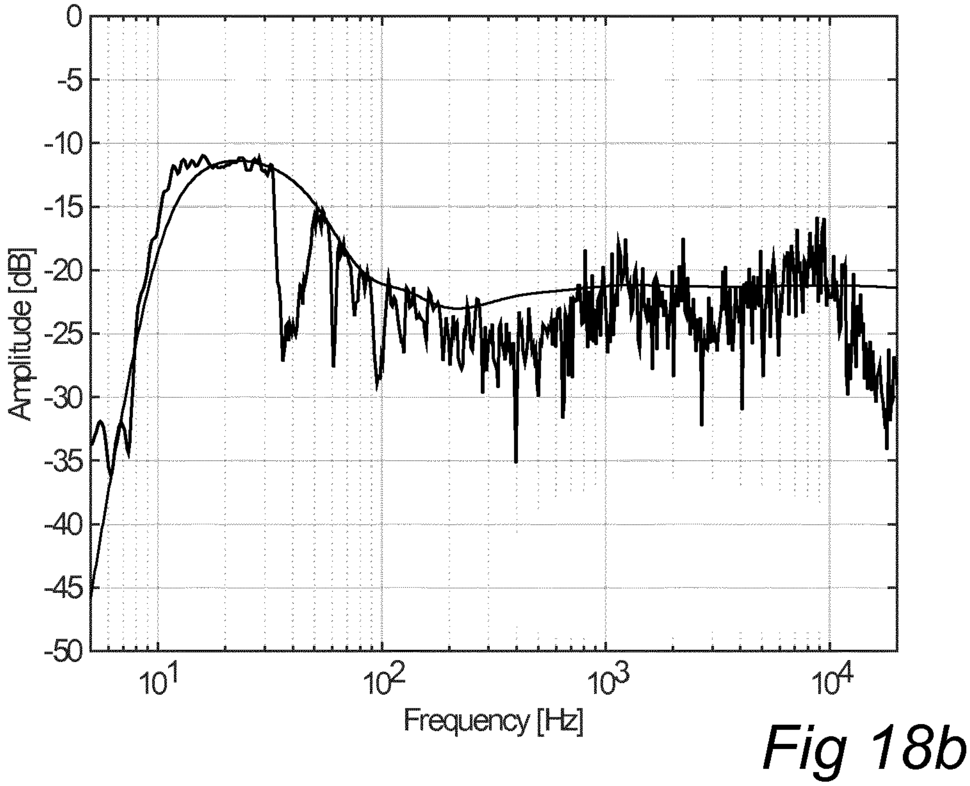

FIG. 18*a* shows the resulting response (dotted) when applying left and right filters to a pure mono signal along with the mono target (solid). FIG. 18*b* shows the resulting response (dotted) when applying left, right, and mono filters to a pure mono signal along with the mono side target (solid).

The person skilled in the art realizes that the present invention by no means is limited to the preferred embodiments described above. On the contrary, many modifications and variations are possible within the scope of the appended claims. For example, it is noted that a different choice of distance between the speakers and the listening position will influence the details in the examples. An asymmetric placement of the speakers may also be contemplated, in which case the left and right targets will no longer be identical. Further, additional or different processing of the filters than that proposed above may be useful. Also, other combinations of filters and input signals than those depicted in FIG. 14 may be considered.

The invention claimed is:

1. A method for smoothing a frequency response between a signal applied to a speaker and a resulting power average in a listening position, comprising:

determining a number of peaks per octave in the response, for a portion of the response where the number of peaks per octave is below a first threshold, smoothing the response with a first smoothing width, for a portion of the response where the number of peaks per octave is above a second threshold, smoothing the response with a second smoothing width, wherein said second threshold is greater than said first threshold and said second smoothing width is wider than said first smoothing width, for a portion of the response where the number of peaks per octave is between the first and second thresholds, smoothing with an intermediate smoothing width, determining a filter based on the smoothed responses including the portion of the response as respectively smoothed with the first smoothing width, the second smoothing width, and the intermediate smoothing width, and during playback, applying the filter.

2. The method according to claim 1, wherein the intermediate smoothing width is frequency dependent as an interpolation of the first and second smoothing width.

3. The method according to claim 1, wherein the first, narrow smoothing width is less than ¼ octave, and the second, wide smoothing width is at least one octave.

4. The method according to claim 3, wherein the first, narrow smoothing width is 1/12.

5. The method according to claim 1, wherein the first, smaller threshold is less than eight peaks per octave, and the second, greater threshold is greater than eight peaks per octave.

6. The method according to claim 5, wherein the first, smaller threshold is five peaks per octave.

7. The method according to claim 5, wherein the second, greater threshold is ten peaks per octave.

8. The method according to claim 5, wherein the first, smaller threshold is five peaks per octave, and the second, greater threshold is ten peaks per octave.

9. The method according to claim 1, wherein:

the intermediate smoothing width is frequency dependent as an interpolation of the first and second smoothing width;

the first, narrow smoothing width is less than ¼ octave;

the second, wide smoothing width is at least one octave;

the first, smaller threshold is less than eight peaks per octave; and the second, greater threshold is greater than eight peaks per octave.

10. A method for smoothing a frequency response between a signal applied to a speaker and a resulting power average in a listening position, comprising:

determining a number of peaks per octave in the response, for a portion of the response where the number of peaks per octave is below a first threshold, smoothing the response with a first smoothing width, for a portion of the response where the number of peaks per octave is above a second threshold, smoothing the response with a second smoothing width, wherein said second threshold is greater than said first threshold and said second smoothing width is wider than said first smoothing width, for a portion of the response where the number of peaks per octave is between the first and second thresholds, smoothing with an intermediate smoothing width, providing a reference by smoothing the response with a reference smoothing width, wherein the reference smoothing width is wider than the second, wide smoothing width, comparing the smoothed response and the reference, for each frequency, selecting the maximum of the smoothed response and the reference as dip removed response, determining a filter based on the smoothed responses including the portion of the response as respectively smoothed with the first smoothing width, the second smoothing width, and the intermediate smoothing width, and during playback, applying the filter.

11. The method according to claim 10, wherein the reference smoothing width is at least two octaves.

12. The method according to claim 10, wherein the intermediate smoothing width is frequency dependent as an interpolation of the first and second smoothing width.

13. The method according to claim 10, wherein the first, narrow smoothing width is less than ¼ octave, and the second, wide smoothing width is at least one octave.

14. The method according to claim 13, wherein the first, narrow smoothing width is $\frac{1}{12}$.

15. The method according to claim 10, wherein the first, smaller threshold is less than eight peaks per octave, and the second, greater threshold is greater than eight peaks per octave.

16. The method according to claim 15, wherein the first, smaller threshold is five peaks per octave.

17. The method according to claim 15, wherein the second, greater threshold is ten peaks per octave.

18. The method according to claim 15, wherein the first, smaller threshold is five peaks per octave, and the second, greater threshold is ten peaks per octave.

19. A method for smoothing a frequency response between a signal applied to a speaker and a resulting power average in a listening position, comprising:

determining a number of peaks per octave in the response, for a portion of the response where the number of peaks per octave is below a first threshold, smoothing the response with a first smoothing width, for a portion of the response where the number of peaks per octave is above a second threshold, smoothing the response with a second smoothing width, wherein said second threshold is greater than said first threshold and said second smoothing width is wider than said first smoothing width, for a portion of the response where the number of peaks per octave is between the first and second thresholds, smoothing with an intermediate smoothing width, providing a reference by smoothing the response with a reference smoothing width, wherein the reference smoothing width is wider than the second, wide smoothing width, comparing the smoothed response and the reference, for each frequency, selecting the maximum of the smoothed response and the reference as dip removed response, determining a filter based on the dip removed response, and during playback, applying the filter, wherein:

the intermediate smoothing width is frequency dependent as an interpolation of the first and second smoothing width;

the first, narrow smoothing width is less than ¼ octave;

the second, wide smoothing width is at least one octave;

the first, smaller threshold is less than eight peaks per octave; and the second, greater threshold is greater than eight peaks per octave.

20. The method according to claim 19, wherein the reference smoothing width is at least two octaves.

* * * * *